(12) United States Patent
Kang et al.

(10) Patent No.: US 8,129,833 B2
(45) Date of Patent: Mar. 6, 2012

(54) STACKED INTEGRATED CIRCUIT PACKAGES THAT INCLUDE MONOLITHIC CONDUCTIVE VIAS

(75) Inventors: Pil-kyu Kang, Gyeonggi-do (KR); Jung-Ho Kim, Gyeonggi-do (KR); Jong-Wook Lee, Gyeonggi-do (KR); Seung-woo Choi, Seoul (KR); Dae-Lok Bae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 12/606,799

(22) Filed: Oct. 27, 2009

(65) Prior Publication Data

US 2010/0109164 A1 May 6, 2010

(30) Foreign Application Priority Data

Oct. 31, 2008 (KR) ................ 10-2008-0107855

(51) Int. Cl.
| | |
|---|---|
| H01L 23/02 | (2006.01) |
| H01L 23/053 | (2006.01) |
| H01L 23/12 | (2006.01) |
| H01L 23/48 | (2006.01) |
| H01L 23/52 | (2006.01) |
| H01L 29/40 | (2006.01) |
| H01L 27/10 | (2006.01) |
| H01L 29/74 | (2006.01) |

(52) U.S. Cl. ........ 257/686; 257/211; 257/700; 257/758; 257/777; 257/E21.016; 257/E25.021; 257/E25.027; 257/E27.137; 257/E27.144; 257/E27.161

(58) Field of Classification Search ............ 257/211, 257/686, E27.137, 758, 777, E21.016, E25.021, 257/E25.027, E27.144, E27.161, 700
See application file for complete search history.

(56) References Cited

U.S. PATENT DOCUMENTS

| | | | | |
|---|---|---|---|---|
| 5,404,044 | A * | 4/1995 | Booth et al. | 257/698 |
| 5,463,269 | A * | 10/1995 | Zimmerman | 313/309 |
| 5,876,842 | A * | 3/1999 | Duffy et al. | 428/209 |
| 6,486,549 | B1 * | 11/2002 | Chiang | 257/723 |
| 6,582,992 | B2 | 6/2003 | Poo et al. | |
| 7,119,425 | B2 * | 10/2006 | Jeong et al. | 257/685 |
| 7,494,846 | B2 * | 2/2009 | Hsu et al. | 438/109 |
| 7,531,905 | B2 * | 5/2009 | Ishino et al. | 257/777 |
| 7,594,318 | B2 * | 9/2009 | Zollo et al. | 29/832 |
| 7,683,458 | B2 * | 3/2010 | Akram et al. | 257/621 |
| 7,727,807 | B2 * | 6/2010 | Han | 438/109 |
| 7,727,887 | B2 * | 6/2010 | Christensen et al. | 438/637 |
| 7,821,107 | B2 * | 10/2010 | Pratt | 257/621 |
| 7,838,967 | B2 * | 11/2010 | Chen | 257/621 |
| 7,868,462 | B2 * | 1/2011 | Choi et al. | 257/777 |

(Continued)

FOREIGN PATENT DOCUMENTS

KR 10-0435813 B1 6/2004

*Primary Examiner* — Ida M Soward
(74) *Attorney, Agent, or Firm* — Myers Bigel Sibley & Sajovec, P.A.

(57) ABSTRACT

Microelectronic packages are fabricated by stacking integrated circuits upon one another. Each integrated circuit includes a semiconductor layer having microelectronic devices and a wiring layer on the semiconductor layer having wiring that selectively interconnects the microelectronic devices. After stacking, a via is formed that extends through at least two of the integrated circuits that are stacked upon one another. Then, the via is filled with conductive material that selectively electrically contacts the wiring. Related microelectronic packages are also described.

10 Claims, 21 Drawing Sheets

U.S. PATENT DOCUMENTS

| | | | |
|---|---|---|---|
| 2002/0074670 A1* | 6/2002 | Suga | 257/777 |
| 2003/0107119 A1 | 6/2003 | Kim | |
| 2005/0067713 A1* | 3/2005 | Mutta et al. | 257/774 |
| 2006/0205211 A1* | 9/2006 | Kirby | 438/667 |
| 2006/0228825 A1* | 10/2006 | Hembree | 438/51 |
| 2008/0083976 A1 | 4/2008 | Haba et al. | |
| 2008/0087459 A1* | 4/2008 | Das et al. | 174/260 |
| 2008/0203554 A1* | 8/2008 | Nishio et al. | 257/686 |
| 2008/0230912 A1* | 9/2008 | Lee et al. | 257/758 |
| 2009/0001602 A1* | 1/2009 | Chung | 257/777 |
| 2009/0283872 A1* | 11/2009 | Lin et al. | 257/621 |
| 2009/0296310 A1* | 12/2009 | Chikara | 361/301.4 |

* cited by examiner

STACKED INTEGRATED CIRCUIT PACKAGES THAT INCLUDE MONOLITHIC CONDUCTIVE VIAS

CROSS-REFERENCE TO RELATED APPLICATION

This application claims priority under 35 USC §119 to Korean Patent Application No. 10-2008-0107855, filed on Oct. 31, 2008, the disclosure of which is hereby incorporated herein by reference in its entirety as if set forth fully herein.

BACKGROUND OF THE INVENTION

This invention relates to methods of packaging integrated circuits and integrated circuits so packaged, and more particularly to methods of stacking integrated circuits to form three-dimensional (3D) microelectronic packages and microelectronic packages so formed.

Integrated circuits are widely used in consumer, commercial and other applications to provide memory devices, logic devices, processor devices, sensor devices, electro-optical devices and many other microelectronic devices. Integrated circuits generally include therein large numbers of active and passive devices. An integrated circuit generally includes at least one single element and/or compound semiconductor layer. The semiconductor layer may also include a single element and/or compound semiconductor substrate, and one or more epitaxial layers. Active devices are generally formed in the semiconductor layer. A wiring layer is also provided on the semiconductor layer to provide a wiring pattern that is used to interconnect the semiconductor devices that are in the semiconductor layer and/or to provide input/output (I/O) connections to devices that are external of the integrated circuit. The wiring layer may include one or more wiring patterns that are insulated from one another and from the semiconductor layer by one or more insulating layers.

The integration density of integrated circuits continues to increase, so that more and more active and passive devices may be provided in a given integrated circuit. Additional integration density may also be provided by stacking integrated circuit substrates upon one another to provide stacked or three-dimensional (3D) integrated circuit structures. More specifically, integrated circuits may be stacked upon one another, face-to-face. These stacked devices may decrease the wiring lengths and may provide high packing density, high speed operation, low power consumption, low cost, and/or parallel processing. Stacked integrated circuits generally include a conductive via that extends through a given integrated circuit, so that both faces of the integrated circuit may be connected to other devices. Since integrated circuits often include a silicon semiconductor layer, these conductive vias that extend through the integrated circuit are often referred to as "through-silicon vias" (TSVs).

As is well known to those having skill in the art, integrated circuits are generally fabricated as wafers, in which tens, hundreds or more chips are fabricated and then singulated into individual chips. The active/passive devices may be formed in the integrated circuits at the wafer stage, and the wiring layers may also be formed on the semiconductor layer at the wafer stage. Through-silicon vias may be fabricated in the integrated circuits at the wafer stage as well, prior to forming the active devices therein and/or after forming the active devices therein. The wafers, including the through-silicon vias may then be bonded together and stacked.

SUMMARY OF THE INVENTION

Microelectronic packages may be fabricated, according to various embodiments, by stacking of plurality of integrated circuits upon one another. A respective integrated circuit includes a semiconductor layer having active microelectronic devices therein and a wiring layer on the semiconductor layer having wiring that selectively interconnects the active microelectronic devices. After stacking, a via is formed that extends through at least two of the plurality of integrated circuits that are stacked upon one another, including through the semiconductor layers and through the wiring layers thereof. Then, after forming the via that extends through at least two the plurality of integrated circuits that are stacked upon one another, the via is filled with conductive material that selectively electrically contacts the wiring. In some embodiments, the wiring includes input/output pads and the via is filled to selectively electrically contact the input/output pads. Accordingly, vias are formed and filled after stacking the integrated circuits upon one another, which can thereby reduce the cost and/or complexity of the fabrication process.

In some embodiments, the via is a linear via that extends through at least two of the plurality of integrated circuits including through the semiconductor layers and through the wiring layers thereof, to define a continuous sidewall in the plurality of integrated circuits. The sidewalls of the semiconductor layers are then recessed relative to the wiring layers. In other embodiments, an insulating layer is formed on the recessed sidewalls of the semiconductor layers. The insulating layer may be formed on the recessed sidewalls of the semiconductor layers by forming an insulating layer on the sidewalls of the wiring layers and on the recessed sidewalls of the semiconductor layers, and then removing the insulating layer from the sidewalls of the wiring layers. More specifically, the sidewalls of the semiconductor layers may be recessed relative to the wiring layers by wet etching the semiconductor layers and wiring layers using an etchant that selectively etches the semiconductor layers relative to the wiring layers. Moreover, the insulating layer may be formed using low-temperature plasma oxide deposition.

In still other embodiments, stepped vias may be formed and filled. In particular, in some embodiments, a first and a second integrated circuit are stacked upon one another, such that the wiring layer of the first integrated circuit is adjacent the substrate of the second integrated circuit. A stepped via is then formed that recesses a sidewall of the semiconductor layer of the second integrated circuit relative to a sidewall of the wiring layer of the first integrated circuit, so as to expose a portion of the wiring of the first integrated circuit. The via is then filled with conductive material that selectively electrically contacts the portion of the wiring of the first integrated circuit. In some of these embodiments, the wirings of the first and second integrated circuits are laterally offset from one another, so that the stepped via may be formed by etching the wiring layer of the second and first integrated circuits using the laterally offset wiring of the first integrated circuit as an etch mask. Moreover, in some of these offset via embodiments, an insulating layer may be formed on the sidewalls of the stepped via that exposes the portion of the wiring of the first integrated circuit. The insulating layer maybe formed using low temperature plasma oxide deposition and multiple masking steps.

The integrated circuits may be stacked on one another by bonding the integrated circuits to one another. In some embodiments, direct bonding of the plurality of integrated circuits may be used, for example by forming a direct oxygen bond between adjacent faces of the integrated circuits. The direct bonding may avoid the use of a glue layer between the adjacent faces of the integrated circuits, in some embodiments. In other embodiments, a glue layer may be used.

In still other embodiments, the via extends through at least two of the plurality of integrated circuits that are stacked upon one another, but only extends partially through an outermost semiconductor layer of a first one of the plurality of integrated circuits. After filling the via, the outermost semiconductor layer of the first one of the plurality of integrated circuits is then thinned to expose the via that is filled.

In still other embodiments, the stacking, forming a via and filling the via may be performed on the integrated circuits at a wafer level. Thus, in some embodiments, a plurality of integrated circuit wafers are stacked upon one another. Then, a via that extends through at least two of the plurality of integrated circuit wafers is formed. Linear vias, stepped vias, direct bonding and other techniques that were described above may be employed. After filling the via, the stacked integrated circuit wafers having the filled via are diced.

Microelectronic packages according to various embodiments include a plurality of integrated circuits that are stacked upon one another, wherein a respective integrated circuit includes a semiconductor layer including active microelectronic devices therein, and a wiring layer on the semiconductor layer having wiring that selectively interconnects the active microelectronic devices. A monolithic conductive via extends through the plurality of integrated circuits including through the semiconductor layers and through the wiring layers thereof. The monolithic conductive via selectively electrically contacts the wiring.

In some embodiments, the semiconductor layers include recessed sidewalls relative to the wiring layers, and an insulating layer is provided between the recessed sidewalls and the monolithic conductive via. In other embodiments, the monolithic conductive via selectively electrically contacts the wiring at the wiring layer sidewalls. In yet other embodiments, a sidewall of a semiconductor layer of a second integrated circuit is recessed relative to a sidewall of a wiring layer of a first integrated circuit, so as to expose a portion of the wiring layer of the first integrated circuit, and a stepped monolithic conductive via electrically contacts the portion of the wiring layer of the first integrated circuit. An insulating layer also may be provided between the sidewalls of the first and second integrated circuits and the monolithic conductive via. The integrated circuits may be directly attached to one another, for example by oxygen bonds and without an intervening glue layer. The integrated circuits may be integrated circuit chips, or integrated circuit wafers, and the vias may selectively interconnect input/output pads thereof.

DETAILED DESCRIPTION

Figure 1:
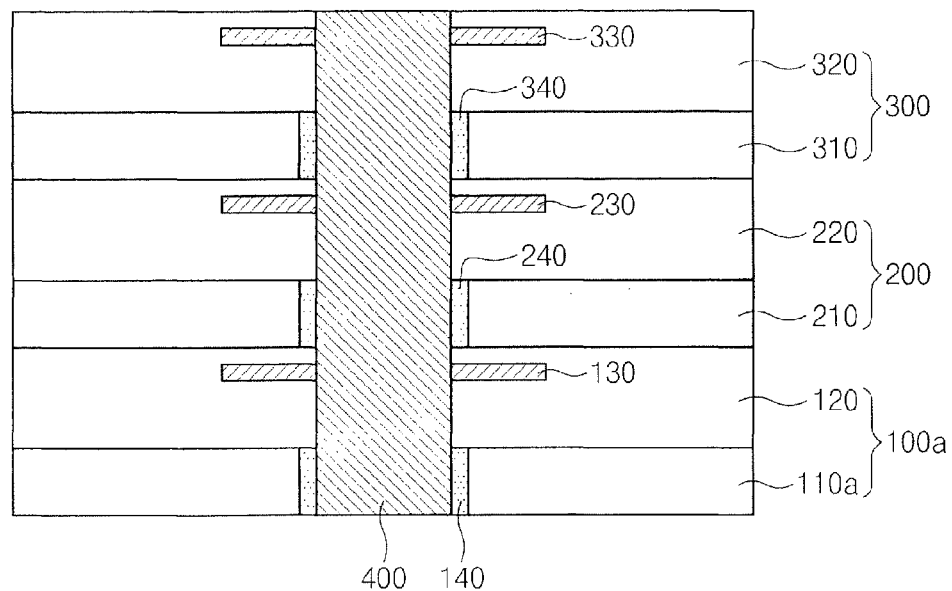
FIG. 1 is a cross-sectional view of a microelectronic package according to various embodiments, including a linear monolithic conductive via.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate. Moreover, as used herein, "monolithic" means constituting one undifferentiated whole. Thus, a monolithic conductive via means a conductive via that is fabricated as one single structure and constitutes one undifferentiated whole, without seams or other interrupting structures therein.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Various embodiments can provide microelectronic packages and fabrication methods therefor, wherein wafers are stacked and bonded and then through-silicon vias are collectively formed in the stacked wafers. The conductive vias may be insulated from the semiconductor layers by providing a selective silicon wet etch to recess the sidewalls of the semiconductor layers, and using a low temperature plasma oxide deposition to form an insulating layer on the recessed sidewalls of the semiconductor layers. Thus, the monolithic conductive via may be insulated from the semiconductor layers, but may be electrically connected to input/output (I/O) pads in the wiring layers. Accordingly, low cost and/or reduced complexity fabrication processes may be provided.

FIG. 1 is a cross-sectional view of a microelectronic package according to various embodiments, including a linear monolithic conductive via. As shown in FIG. 1, the microelectronic package includes three integrated circuits $100a$, $200$ and $300$. Although three integrated circuits are illustrated in FIG. 1, fewer or more integrated circuits may be employed in various embodiments. Each integrated circuit includes a semiconductor layer $110a$, $210$, $310$ that includes active/passive microelectronic devices therein, and a wiring layer $120$, $220$, $320$ on the semiconductor layer having wiring that selectively interconnects the microelectronic devices and that also provides input/output connections external to the integrated circuit.

Continuing with the description of FIG. 1, each of the semiconductor layers $110a$, $210$, $310$ may be a single element and/or compound semiconductor layer. Each semiconductor layer may also include a single element and/or compound bulk semiconductor substrate and one or more epitaxial semiconductor layers. For example, a semiconductor layer may include a thin semiconductor layer that is spaced apart from a substrate by an intervening insulating layer and that is fabricated, for example, using semiconductor-on-insulator (SOI) technology and/or other similar technology. In some embodiments, the substrate may be at least partially removed or thinned. As will be described in detail below, in some embodiments, the bottommost substrate may be fabricated differently than the remaining substrates. Accordingly, a reference number $100a$, rather than $100$, and a reference number $110a$, rather than $110$, is used in FIG. 1.

From a functional standpoint, the integrated circuits $100a$, $200$ or $300$ may include identical functionality and/or different functionality. For example, each of the integrated circuits $100a$, $200$, $300$ may be an identical memory chip in some embodiments. However, in other embodiments, at least some of the integrated circuits may have different functionalities to operate as a processor, sensor, controller, memory, optical device, etc.

The wiring layers $120$, $220$, $320$ may include a plurality of wiring patterns therein that are used to selectively interconnect the microelectronic devices in the associated semiconductor layer. Moreover, one or more of the wiring layers may also include an input/output pad $130$, $230$, $330$ that is used to provide a connection external of the integrated circuit $100a$, $200$, $300$. The various wiring patterns may be insulated from one another by inter-dielectric layers of various types. Moreover, each integrated circuit may include the same number or different numbers of wiring layers.

It will also be understood that FIG. 1 may be viewed as illustrating various other embodiments of the invention, wherein the integrated circuits $100a$, $200$, $300$ are included in a wafer prior to singulation or wherein the integrated circuits are already singulated. Thus, FIG. 1 can represent a plurality of stacked wafers before singulation and a plurality of stacked chips after singulation.

Continuing with the description of FIG. 1, a monolithic conductive via $400$ extends through the plurality of integrated circuits $100a$, $200$, $300$ including through the semiconductor layers $110a$, $210$, $310$ thereof, and through the wiring layers $120$, $220$, $320$ thereof. The monolithic conductive via $400$ selectively electrically connects the wiring. Thus, as shown in FIG. 1, the monolithic conductive via $400$ electrically contacts the input/output pads $130$, $230$ and $330$. It will be understood, however, that not every input/output pad that is adjacent the monolithic conductive via $400$ need be electrically connected thereto. Moreover, as shown in FIG. 1, insulating layers 140, 240, 340 may be provided on at least some of the sidewalls of semiconductor layers 110a, 210, 310, respectively. Moreover, the sidewalls of the semiconductor layers 110a, 210, 310 may be recessed relative to the sidewalls of the wiring layers 120, 220, 320. In other embodiments, however, the semiconductor layer 110a, 210 and/or 310 may be connected to the monolithic conductive via.

Figure 2:
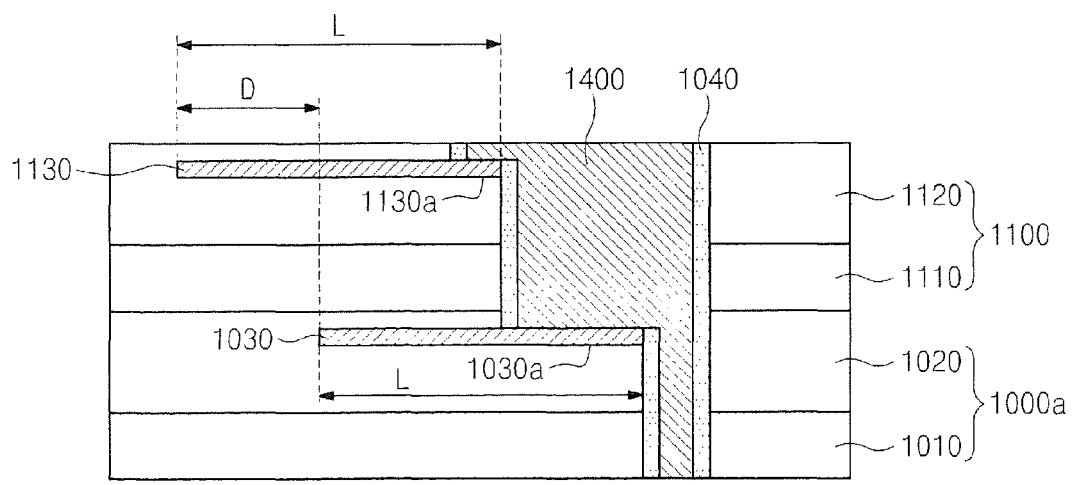
FIG. 2 is a cross-sectional view of a microelectronic package according to various embodiments, including a stepped monolithic conductive via.

Embodiments of FIG. 1 include a linear monolithic conductive via 400 that includes a continuous sidewall. The continuous sidewall may be orthogonal to the integrated circuit faces, as illustrated in FIG. 1, oblique to the integrated circuit faces, or curved to form an arc relative to the integrated circuit faces. In contrast, embodiments of FIG. 2 illustrate a stepped monolithic conductive via 1400. More specifically, referring to FIG. 2, a plurality of integrated circuits, such as integrated circuits 1000a and 1100, are stacked upon one another, wherein a respective integrated circuit includes a semiconductor layer 1010, 1110 having microelectronic devices therein, and a wiring layer 1020, 1120 on the semiconductor layer 1010, 1110, having wiring including one or more input/output pads 1030, 1130. Integrated circuits 1000a, 1100 may include all of the various embodiments that were described above in connection with FIG. 1. These many embodiments will not be described again for the sake of brevity.

As shown in FIG. 2, the wiring layer 1020 of the first integrated circuit 1000a is adjacent the semiconductor layer 1110 of the second integrated circuit 1100. Moreover, as shown, a sidewall of the second integrated circuit 1100, including a sidewall of the semiconductor layer 1110, is recessed relative to a sidewall of the first integrated circuit 1000a, including a sidewall of the first wiring layer 1020, by a distance D, so as to expose a portion of the wiring layer 1020 on a face of the first integrated circuit 1100a. More specifically, as shown, the input/output pads 1030, 1130 of the first and second integrated circuits 1000a, 1100, respectively, are of same length L and are offset from one another by a distance D, in some embodiments. In other embodiments, however, they need not be the same length, so that, for example, in some embodiments, the second pad 1130 may be shorter than the first pad 1030 by a distance D, or may be longer than the first pad 1030. In any event, a portion 1030a of the wiring such as the pad 1030, is exposed on a face of the first integrated circuit 1000a.

Still referring to FIG. 2, the monolithic conductive via 1400 is a stepped monolithic conductive via 1400 that electrically contacts the portion 1030a of the first wiring that is exposed on the face of the first integrated circuit 1000a. The stepped monolithic conductive via 1400 may also contact an exposed portion 1130a of the second wiring 1130 that is exposed on the face of the second integrated circuit 1100. Finally, an insulating layer 1040 also may be provided. The insulating layer 1040 may insulate the sidewalls of the semiconductor layers 1010, 1100 and the sidewalls of the wiring layers 1020, 1120 from the stepped monolithic conductive via 1400 in some embodiments. In other embodiments, the insulating layer may allow electrical connection between sidewalls of the wiring layers 1030, 1130 and the monolithic conductive via 1400.

It will be understood that embodiments of FIG. 2 provide a stepped monolithic conductive via 1400 that electrically connects the wiring layer, e.g., pads 1030, 1130, on an exposed face thereof rather than the sidewall thereof. However, in other embodiments, the stepped monolithic conductive via 1400 may electrically contact the wiring at the sidewall thereof, as was the case in FIG. 1. Moreover, embodiments of FIG. 1 may also provide contact between the monolithic via 400 and the face of the wiring layer 130, 230, 330, in addition to or instead of the sidewalls thereof.

FIGS. 3A-3G are perspective views of microelectronic packages according to various embodiments during intermediate fabrication steps according to various embodiments. In general, wafer bonding may take place using an adhesive or glue layer and/or using direct wafer bonding without an intervening adhesive or glue layer.

Figure 3A:
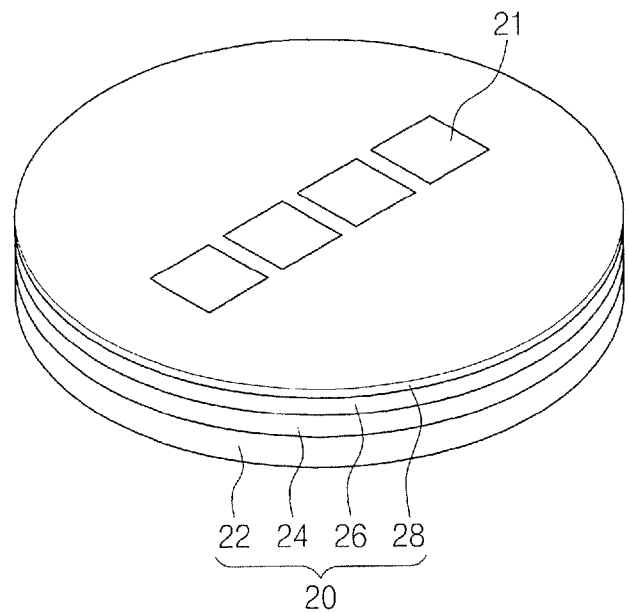
FIGS. 3A-3G are perspective views of microelectronic packages according to various embodiments during intermediate fabrication steps according to various embodiments.

Referring now to FIG. 3A, a semiconductor-on-insulator (SOI) wafer may be fabricated using conventional techniques. The SOI wafer may include a semiconductor substrate 22, an insulating layer 24, a device layer 26 and a wiring layer 28 that are sequentially stacked. The device layer 26 may include a well region, and the wiring layer 28 may include a pad therein. The SOI wafer 20 may include a plurality of SOI chips 21. Thus, the substrate 22, insulating layer 24 and the device layer 26 may constitute an embodiment of a semiconductor layer.

Figure 3B:
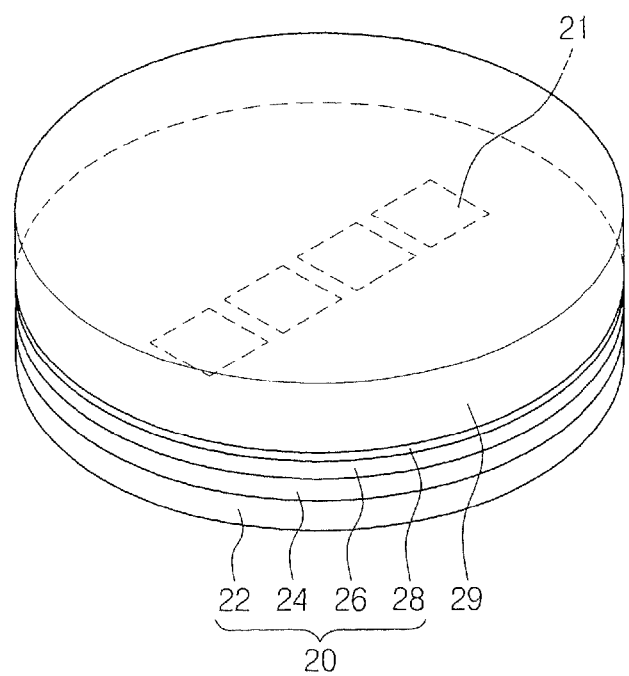

Referring to FIG. 3B, a temporary wafer 29 is attached to the SOI wafer 20. The temporary wafer 29 may be attached to the SOI wafer 20 using an adhesive. The temporary wafer 29 may be glass, plastic, semiconductor and/or other materials.

Figure 3C:
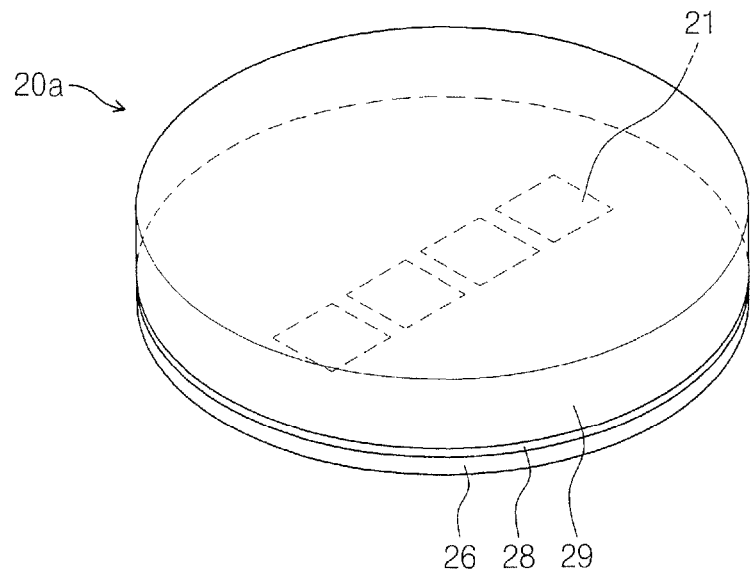

Referring to FIG. 3C, the semiconductor substrate 22 and the insulating layer 24 are removed from the SOI wafer 20, to form a preliminary device wafer 20a. The semiconductor substrate 22 and the substrate insulating layer 24 may be removed by wet etching and/or other processes.

Figure 3D:
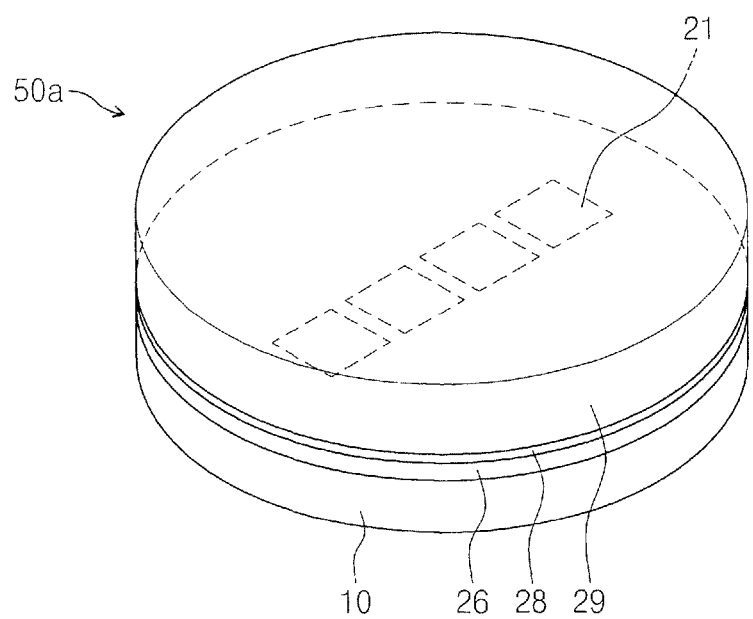

Referring now to FIG. 3D, a base substrate 10 is attached to the preliminary device substrate 20a to form a first preliminary substrate structure 50a. The base substrate 10 may be attached to the preliminary device substrate 20a by a mechanical adhesion method and/or other conventional techniques. A mechanical adhesion method may be used where the base substrate 10 and the preliminary device substrate 28 are relatively flat. The base substrate 10 may include a semiconductor layer 26 and a wiring layer 28 that are sequentially stacked. The wiring layer 28 may include a pad.

As described above, the base substrate 10 may be attached to the preliminary device substrate 20a using direct bonding techniques that may include silicon direct bonding or anodic bonding. In one example of silicon direct bonding, two silicon wafers may be directly attached to one another by placing the wafers face-to-face and heating an oxidizing ambient to create oxygen bonds therebetween. This bonding may take place without the need for an intervening glue layer or adhesive layer. Direct wafer bonding need not be described further herein.

In other embodiments, the base substrate 10 may be attached to the preliminary device substrate 20a using an adhesive, glue or other interlayer using, for example, epoxy bonding, eutectic bonding, polyimide bonding or other direct bonding techniques, such as thermocompressive bonding, low melting temperature glass bonding and/or other techniques.

Figure 3E:
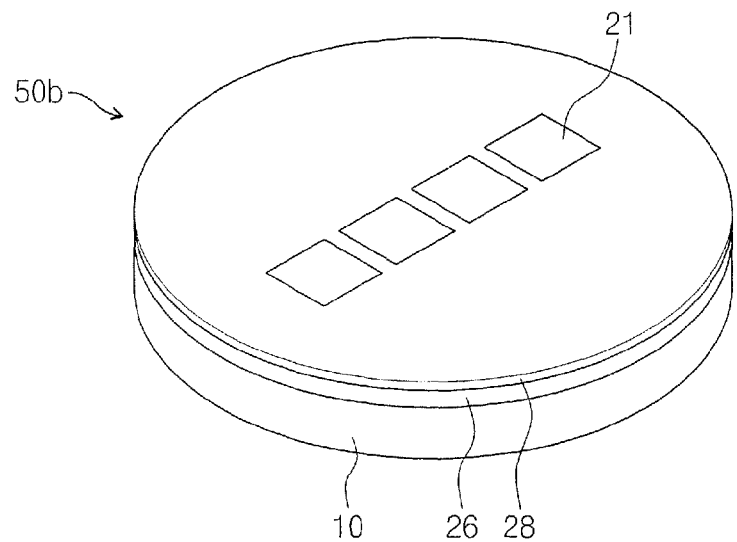

Referring now to FIG. 3E, the temporary substrate 29 is removed to form a first substrate structure 50b. The temporary substrate 29 may be removed, by example, by wet etching.

Figure 3F:
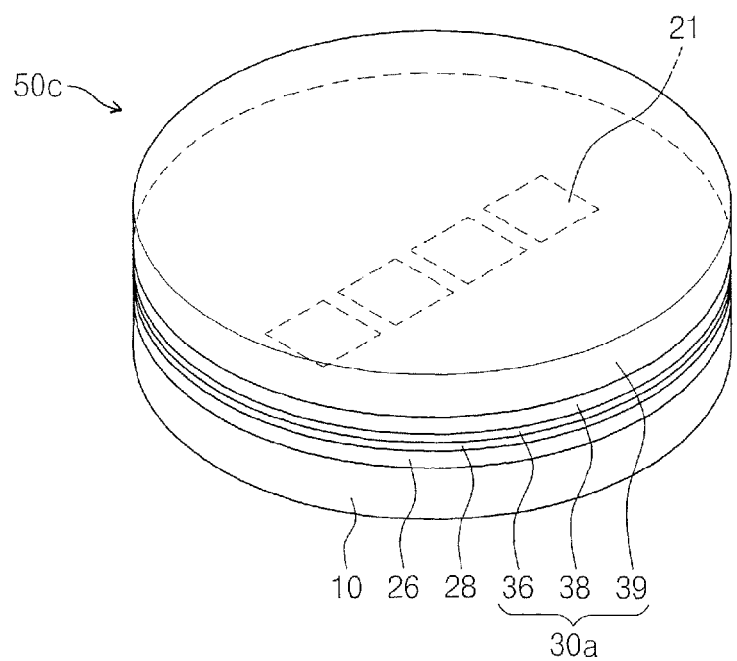

Referring now to FIG. 3F, another preliminary device substrate 30a may be prepared. This preliminary device substrate 30a may be prepared using the same procedures as illustrated in FIGS. 3A-3C, and may include a semiconductor layer 36, a wiring layer 38 and a temporary substrate 39. Preliminary device substrate 30a may then be attached to the first substrate 50b to form a second preliminary substrate structure 50c using direct bonding and/or a glue layer.

Figure 3G:
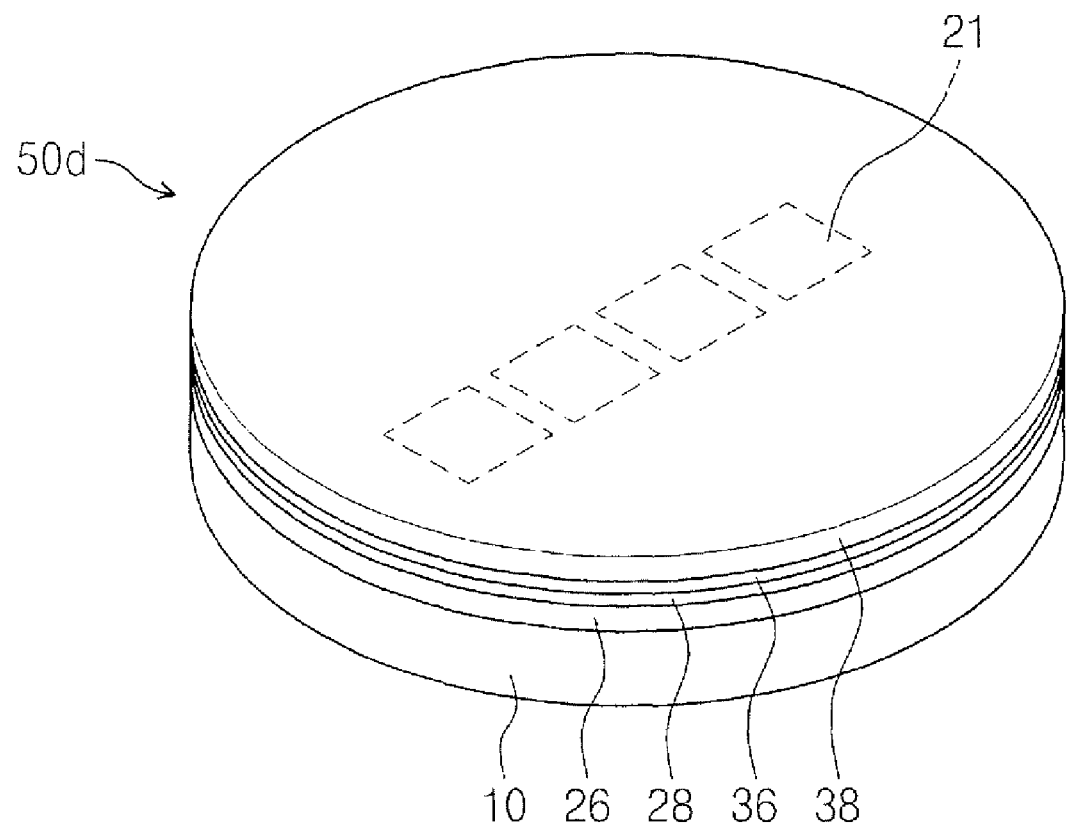

Referring to FIG. 3G, the temporary substrate 39 may be removed from the second preliminary structure 50c to form a second substrate structure 50d. Thus, a substrate structure including a plurality of device substrates stacked on the base substrate can be fabricated. This process can be repeated any given number of times to produce a desired number of integrated circuits that are stacked on one another.

Figure 4A:
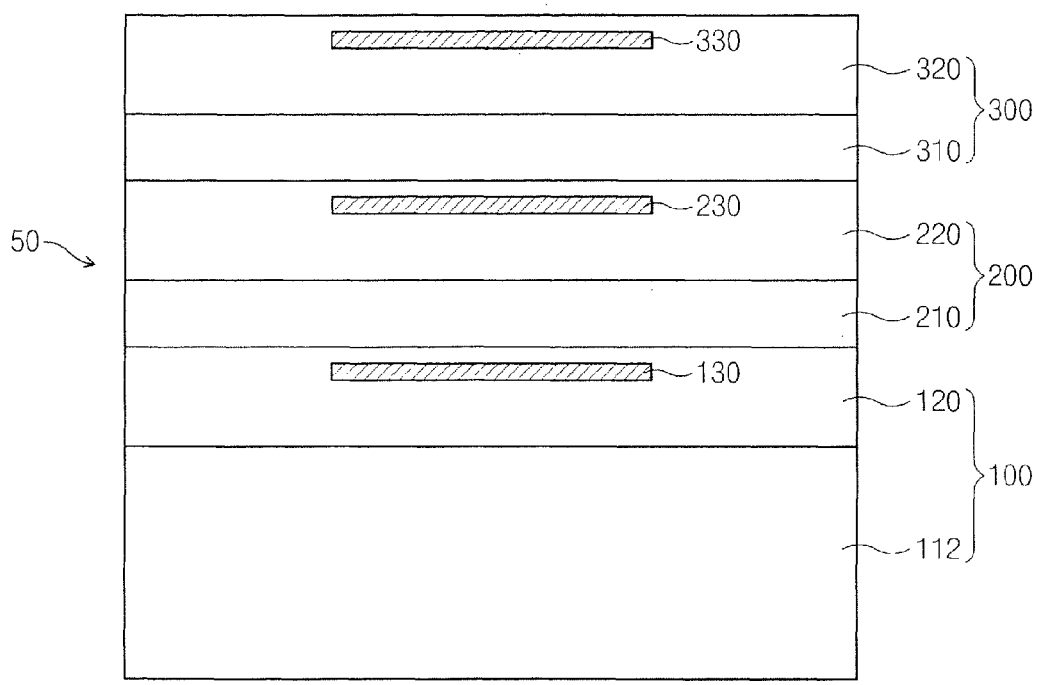
FIGS. 4A-4F are cross-sectional views of microelectronic packages that include linear monolithic conductive vias according to various embodiments during intermediate fabrication steps according to various embodiments.

FIGS. 4A-4F are cross-sectional views of microelectronic packages that include linear monolithic conductive vias according to various embodiments during intermediate fabrication steps according to various embodiments. Referring to FIG. 4A, a microelectronic package 50 may include a plurality of integrated circuits 100, 200, 300 that are stacked upon one another. The integrated circuits 100, 200, 300 may be a plurality of wafers that are stacked on the one another or may be a plurality of chips that are stacked upon one another, as was described above. The first integrated circuit 110 includes a semiconductor layer 112 and a device layer 120 having an input/output pad 130. The second integrated circuit substrate 200 includes a second semiconductor layer 210 and a second wiring layer 220 including a second input/output pad 230 therein. The third integrated circuit 300 includes a third semiconductor layer 310 and a third wiring layer 320 including a third input/output pad 330 therein. Fewer or more integrated circuits may be provided.

The I/O pads 130, 230, 330 may be vertically aligned, as shown in FIG. 4A, in some embodiments. In other embodiments, however, they need not be vertically aligned. Moreover, as was noted, each integrated circuit 100, 200, 300 may be a standalone integrated circuit or may be included in a wafer. Also, the location of the I/O pads 130, 230, 330 may be different in the various devices, and may be internal to the wiring layer 120, 220, 320 or at an exposed portion of the wiring layer 120, 220, 320. The integrated circuits may have a thickness in the range from several micrometers to several tens of micrometers in some embodiments. The first integrated circuit 100 may be thicker because it has not yet been subject to thinning or substrate removal in some embodiments. In other embodiments, however, it also may be thin.

Figure 4B:
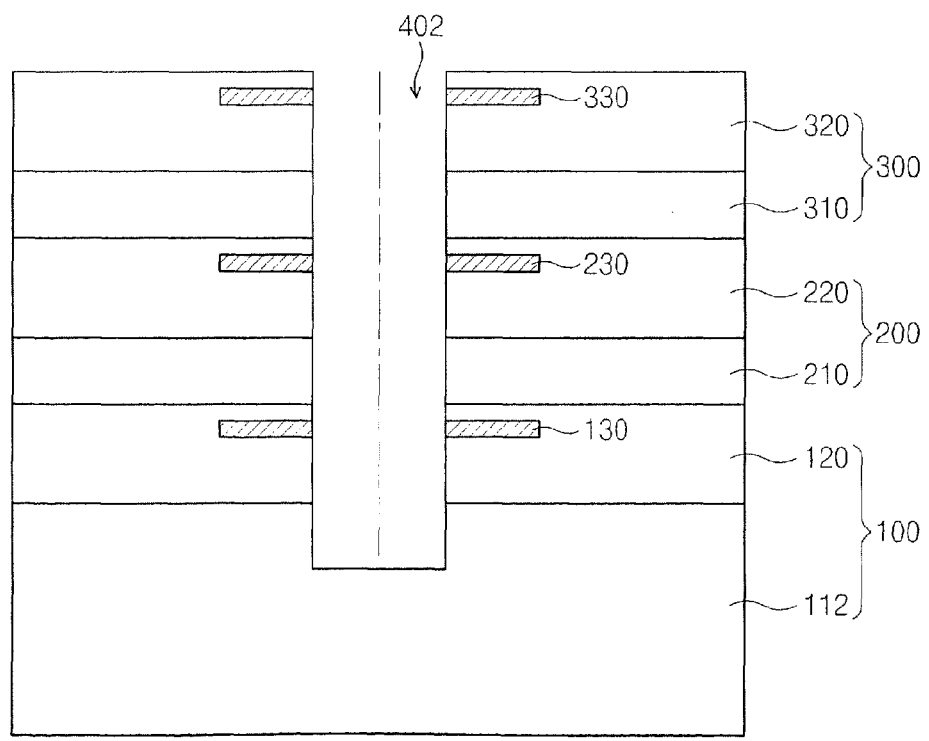

Referring now to FIG. 4B, a via 402 may be formed by patterning the third integrated circuit 300, the second integrated circuit 200, and the first integrated circuit 100. In some embodiments, the via 402 may extend through the third integrated circuit 300 and the second integrated circuit 200, but only partially through the first integrated circuit 100, so that a bottom surface of the via 402 may be located within the first integrated circuit 100. In some embodiments, the floor of the via 402 may be located within the first semiconductor layer 112 at a depth that corresponds to the thickness of the second semiconductor layer 210. However, in other embodiments, the via 402 may penetrate less deep or deeper into the first semiconductor layer 112 or may penetrate entirely through the first semiconductor layer 112.

As also shown in FIG. 4B, the via 402 may also penetrate the first, second and third I/O pads 130, 230 and 330, respectively, and may be of smaller diameter than the length or width of these pads. In some embodiments, the via 402 may be formed by dry etching, such as by reactive ion etching and/or other conventional techniques. In other embodiments, a laser may be used to form the via 402. It will be understood that, although embodiments of FIG. 4B illustrate formation of a single via 402, a plurality of vias 402 may be formed in other embodiments using dry etching, laser etching and/or other techniques.

Figure 4C:
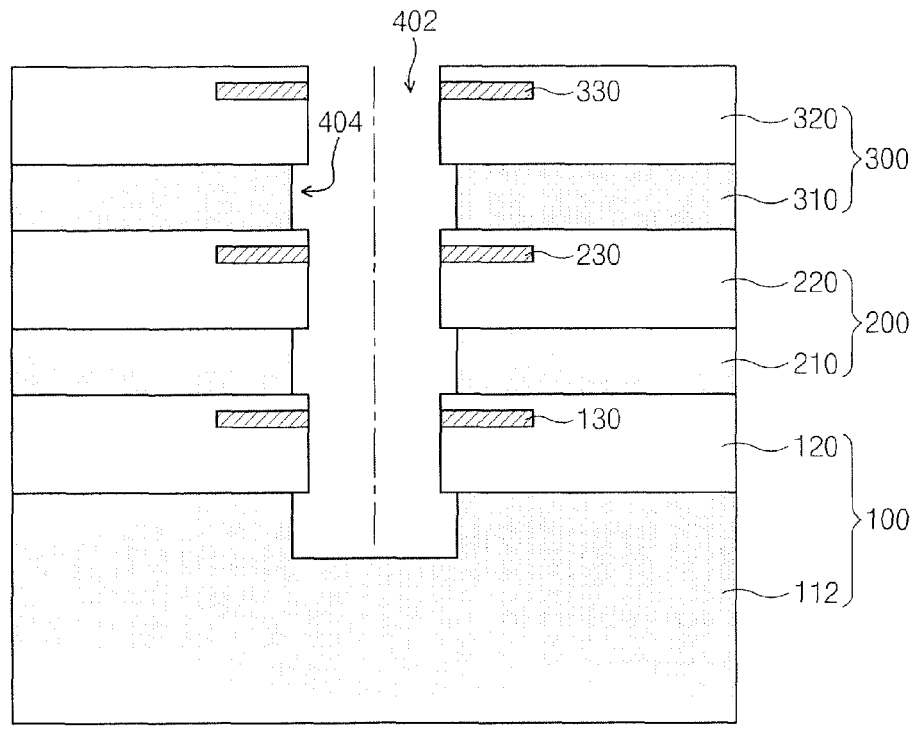

Referring now to FIG. 4C, the sidewalls of the semiconductor layers are recessed relative to the wiring layers. In particular, as shown in FIG. 4C, the sidewalls of the first semiconductor layer 112, the second semiconductor layer 210, and the third semiconductor layer 310 are recessed, for example by wet etching the structure through the via 402. An etchant that selectively etches the semiconductor layers 112, 210, 310 relative to the wiring layers 120, 220, 320 may be used. For example, conventional SC1 etchant may be used.

Figure 4D:
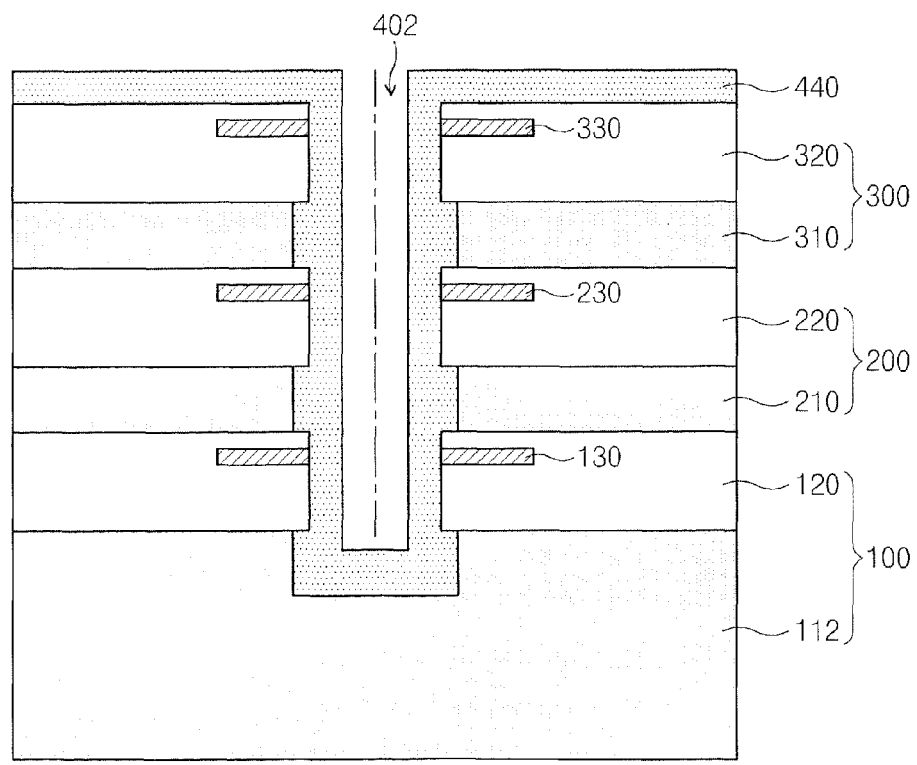

Then, referring to FIG. 4D, an insulating layer 440 may be formed on the exposed portions of the structure. The insulating layer 440 may be formed at relatively low temperature, for example at a temperature less than about 400° C. using a chemical vapor deposition method using plasma, referred to herein as "low temperature plasma oxide deposition". The growth or deposition of the insulating layer 440 may be faster on the semiconductor layers 112, 210 and 310 relative to the wiring layers 120, 220, 320, due to, for example, a higher growth rate on silicon than on silicon dioxide. Thus, the insulating layer 440 may be thicker on the sidewalls of the semiconductor layers 112, 210 and 220 than on the sidewalls of the wiring layers 120, 220, 320. In some embodiments, the insulating layer 420 may comprise silicon dioxide, silicon oxynitride and/or silicon nitride. However, other materials also may be used, and/or other fabrication techniques may be used.

Figure 4E:
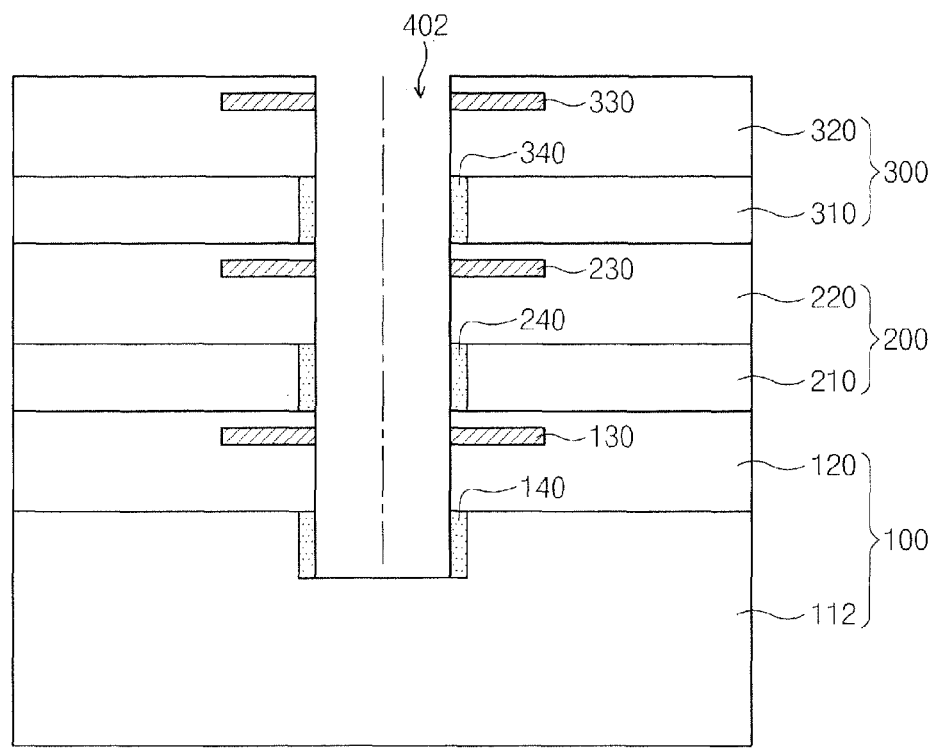

Referring now to FIG. 4E, anisotropic etching may be performed on the resultant structure, so as to remove the insulating layer 440 from the sidewalls of the wiring layers 120, 220, 320. Insulating layers 140, 240 and 340 may remain on sidewalls of the semiconductor layers 112, 210 and 310, respectively. In other embodiments, however, some of the insulating layer 440 may also remain on the sidewalls of the wiring layers 120, 220, 320, as long as the sidewalls of the pads 130, 230, 330 are exposed.

Figure 4F:
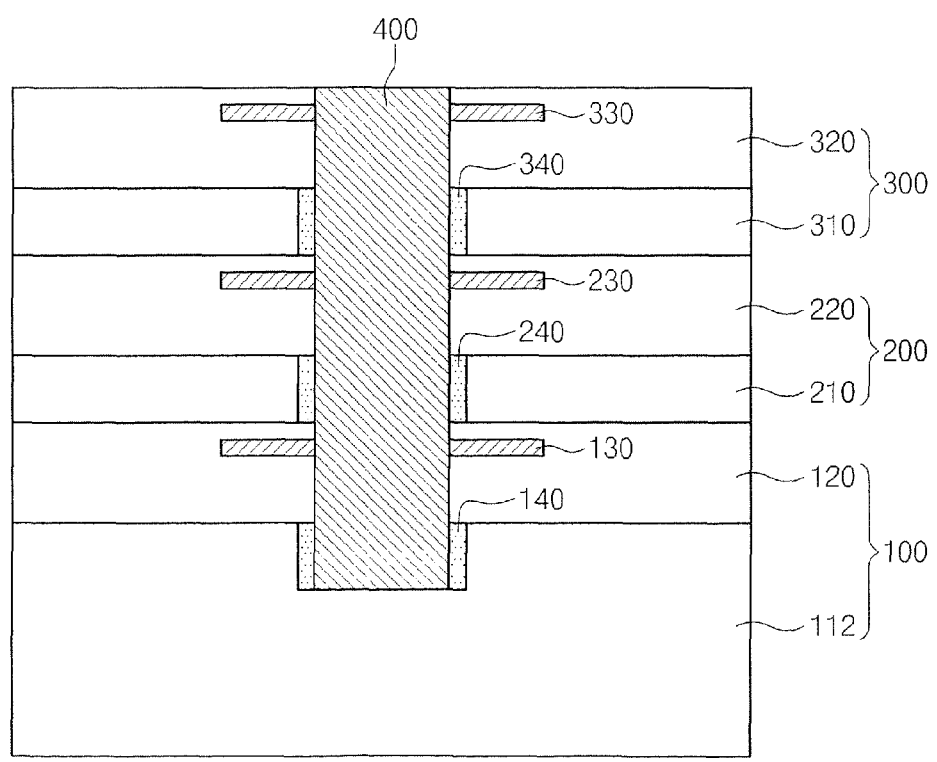

Referring now to FIG. 4F, a monolithic conductive via 400, also referred to as a "conductive electrode", is then formed to fill the via 402.

The conductive electrode 400 may be formed of the same material that is used to form the pads 130, 230, 330, in some embodiments. For example, copper (Cu) and/or aluminum (Au) may be used. The conductive electrode 400 may be formed using chemical vapor deposition (CVD) to fill the via 402, followed by planarization to remove the metal from outside the via. In other embodiments, the conductive electrode may be formed using physical vapor deposition (PVD), chemical vapor deposition (CVD) plating and/or direct electrode implantation.

Still referring to FIG. 4F, the bottom surface of the first semiconductor layer 112 may then be etched, if necessary, to expose the conductive via 400 and produce the structure of FIG. 1. The structure then may be singulated into multiple stacked structures using a laser, saw and/or other conventional techniques. The three-dimensional stacked integrated circuits may then be mounted on a printed circuit board or other packaging substrate.

Figure 5A:
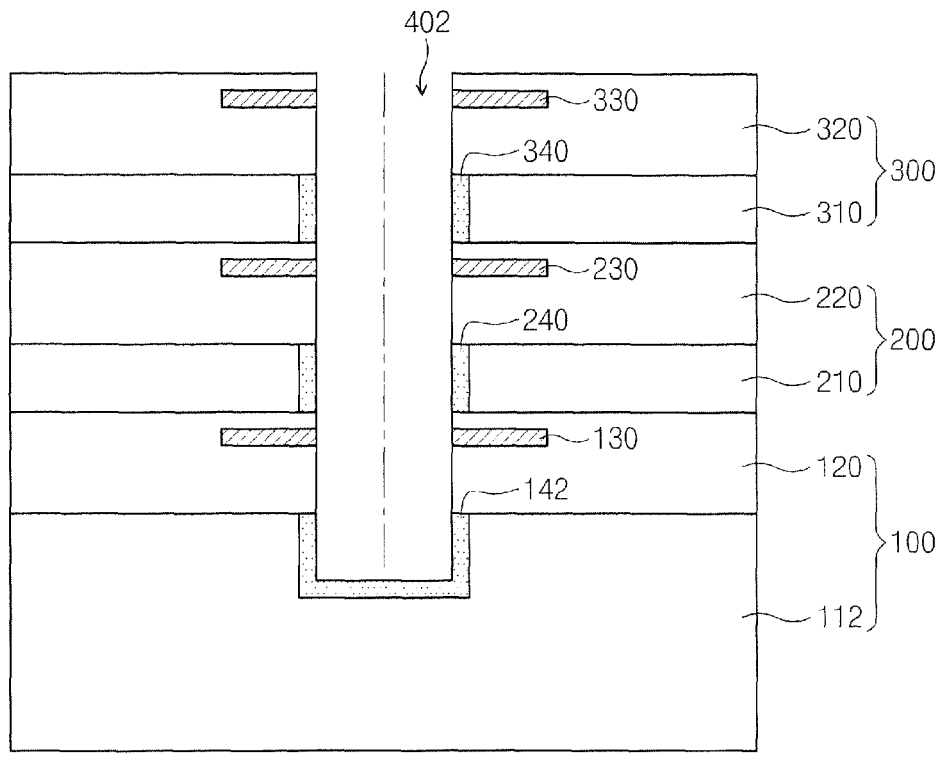
FIGS. 5A-5B are cross-sectional views of other microelectronic packages that include linear monolithic conductive vias according to various embodiments during intermediate fabrication steps according to various other embodiments.
Figure 5B:
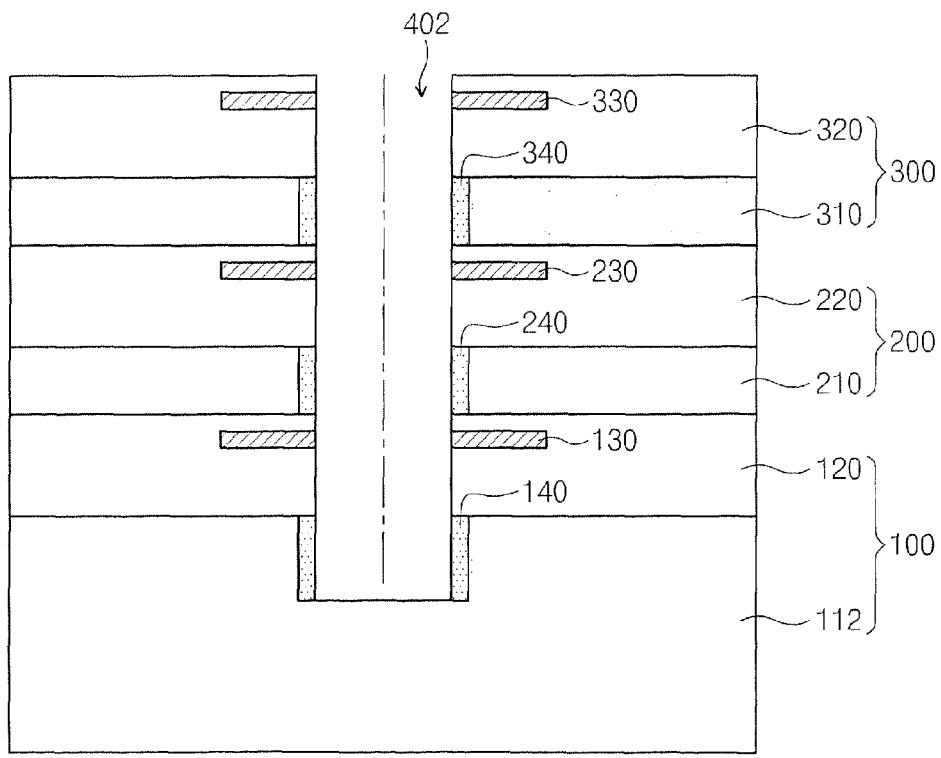

FIGS. 5A and 5B are cross-sectional views of other microelectronic packages that include linear monolithic conductive vias according to various other embodiments during intermediate fabrication steps according to various other embodiments. More specifically, referring to FIG. 5A, a structure may be formed as was described in connection with FIGS. 4A-4C. Then, heat treatment may be performed in an oxidizing or nitridizing environment, to oxidize or nitridize the semiconductor layers 112, 210 and 310 to form insulating layers 142, 240 and 340 in the via 402. If the I/O pads 130, 230, 330 are oxidized or nitridized, an additional process may be performed to remove the oxidization/nitridation on the I/O pads 130, 230, 330.

In other embodiments, the first, second and third semiconductor layers 112, 210 and 310 may be recessed before performing the heat treatment.

Then, referring to FIG. 5B, anisotropic etching may be performed so as to remove a portion of the insulating layer 142 on the floor of the via 402. In other embodiments, the insulating layer 142 on the floor of the via 402 need not be removed, but may be retained or removed later, if desirable. A conductive electrode may then be formed, as was described in connection with FIG. 4F.

Figure 6A:
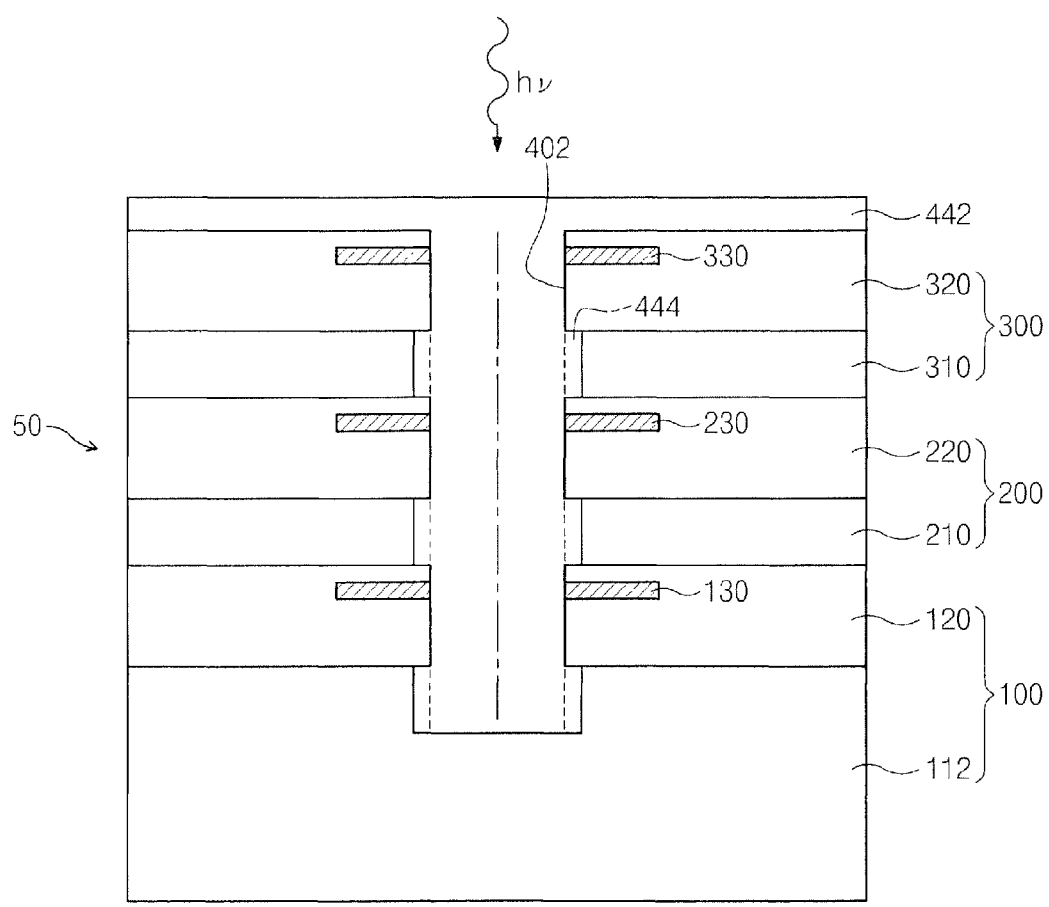
FIGS. 6A-6B are cross-sectional views of yet other microelectronic packages that include linear monolithic conductive vias according to various embodiments during intermediate fabrication steps according to yet other various embodiments.
Figure 6B:
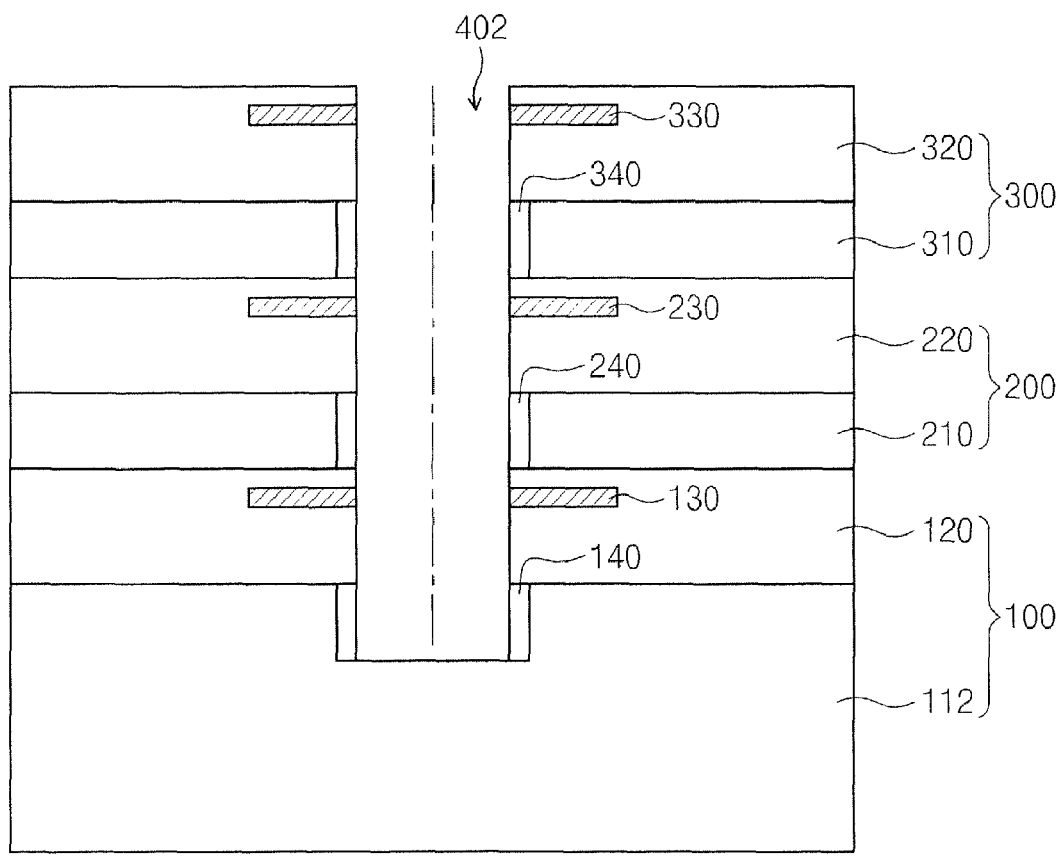

FIGS. 6A and 6B are cross-sectional views of yet other microelectronic packages that include linear monolithic conductive vias according to yet other various embodiments during intermediate fabrication steps according to yet other various embodiments. In particular, operations of FIGS. 4A-4C may be performed. Then, a photosensitive material 442 may be formed in the via hole 402, and may be exposed to light (hv) to develop the exposed portions. Portions of the photosensitive layer 442 that are located in the recesses of the semiconductor layers may not be exposed by the light and developed. It will be understood that the photosensitive material 442 may include photoresist, photosensitive polyimides and/or insulating photosensitive material.

Then, referring to FIG. 6B, the developed portions of the photoresist may be selectively removed, so as to form the insulating layers 140, 240 and 340 from the remaining photosensitive layer.

FIGS. 7A-7E are cross-sectional views of still other microelectronic packages that include linear monolithic conductive vias according to various embodiments during intermediate fabrication steps according to still other embodiments. Embodiments of FIGS. 7A-7E may correspond to embodiments of FIGS. 4A-4F in certain aspects. Accordingly, for the sake of brevity, the common aspects will not be repeated, and the differences will be highlighted.

Figure 7A:
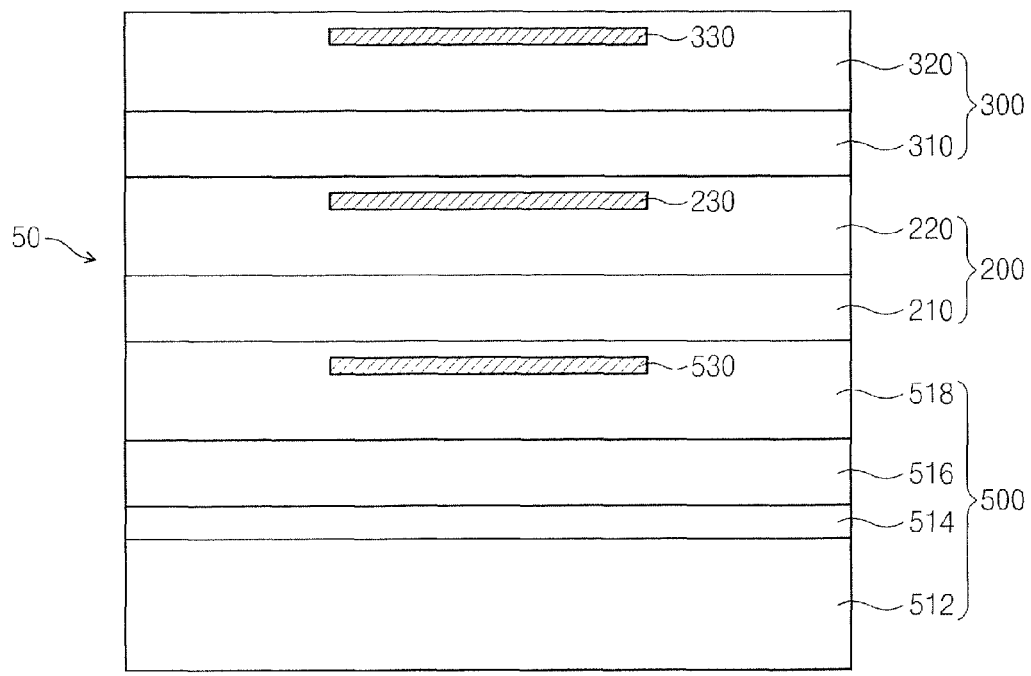
FIGS. 7A-7E are cross-sectional views of still other microelectronic packages that include linear monolithic conductive vias according to various embodiments during intermediate fabrication steps according to still other embodiments.

Referring to FIG. 7A, the first integrated circuit 500 may include a substrate insulating layer 514, a device layer 516 and a wiring layer 518 that are formed on a semiconductor substrate 512. Thus, layers 512, 514 and 516 comprise the semiconductor layer. The wiring layer 518 may include an I/O pad 530. The pads 230, 330 and 530 may be vertically aligned in some embodiments.

Figure 7B:
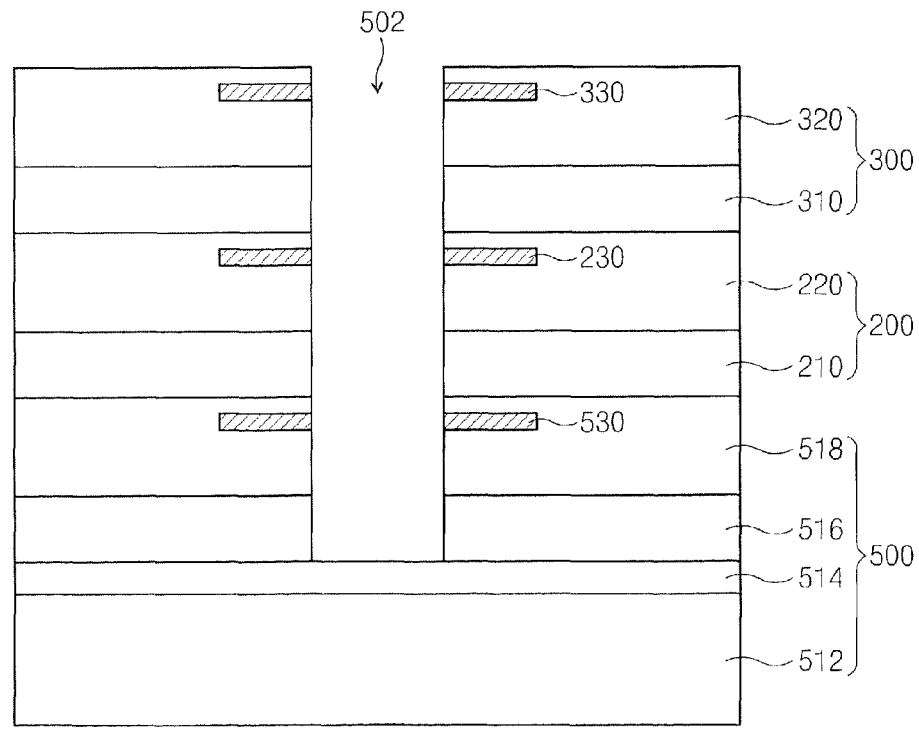

Referring now to FIG. 7B, a via 502 may be formed to penetrate the wiring layer 518 and the device layer 516 of the first integrated circuit 500, but may not penetrate the insulating layer 514 or the semiconductor substrate 512. However, in other embodiments, the via 502 may not fully penetrate the device layer 516 or the wiring layer 518. Moreover, in other embodiments, the via 502 may also penetrate the insulating layer 514 and/or the semiconductor substrate 512, and, in some embodiments, may extend therethrough. The via may be formed by dry etching, laser etching and/or other techniques.

Figure 7C:
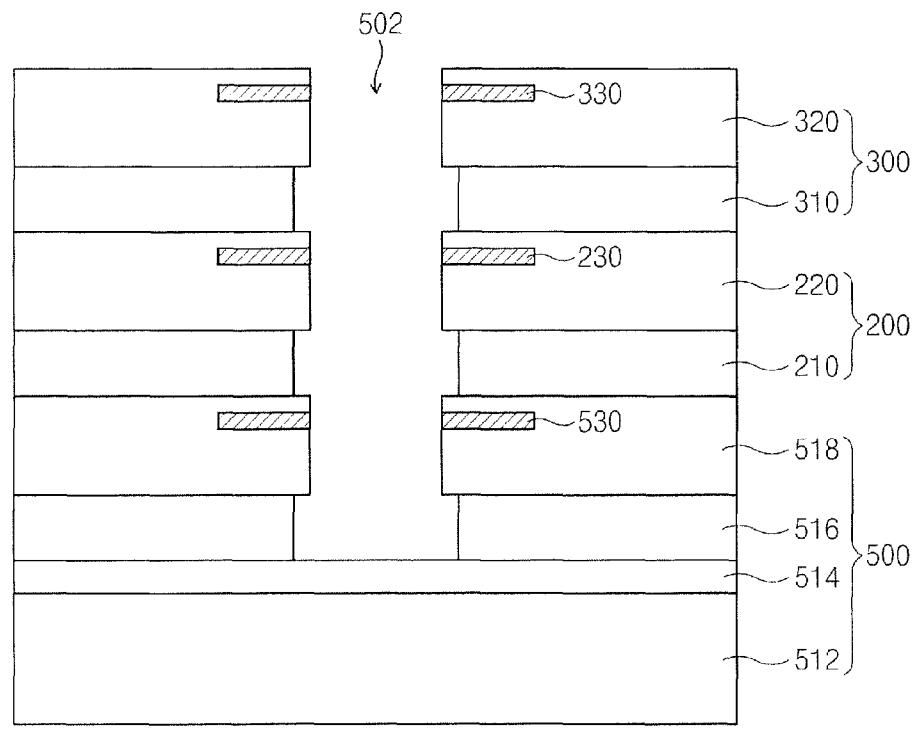

Referring now to FIG. 7C, recesses may be formed using, for example, wet etching as was described above in connection with FIG. 4C.

Figure 7D:
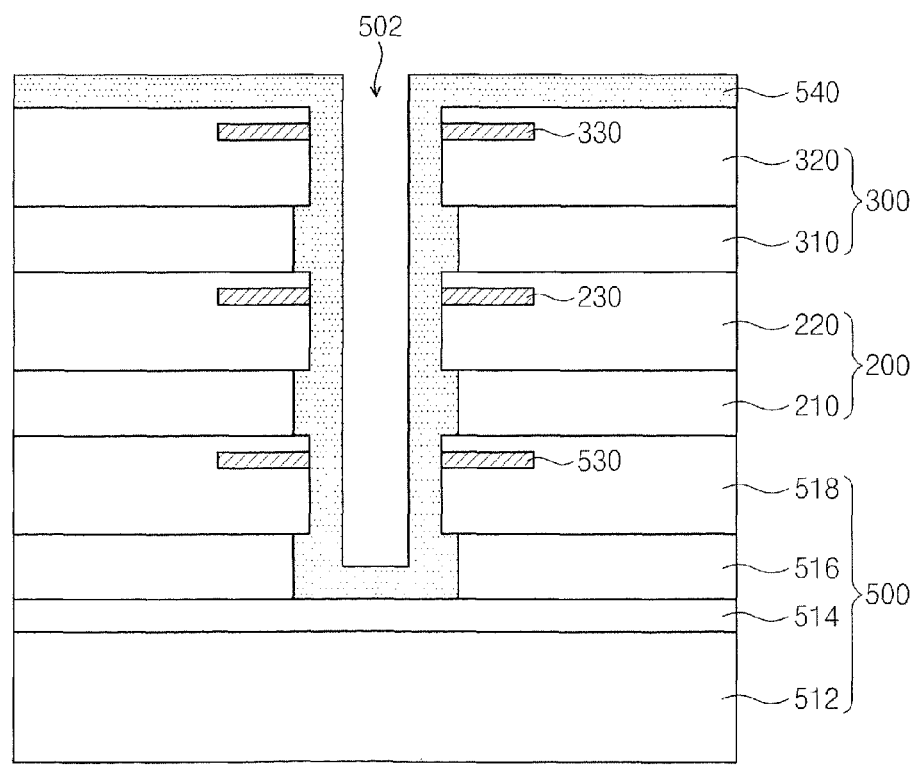

Referring now to FIG. 7D, an insulating layer 540 may be formed similar to the insulating layer 440 of FIG. 4D.

Figure 7E:
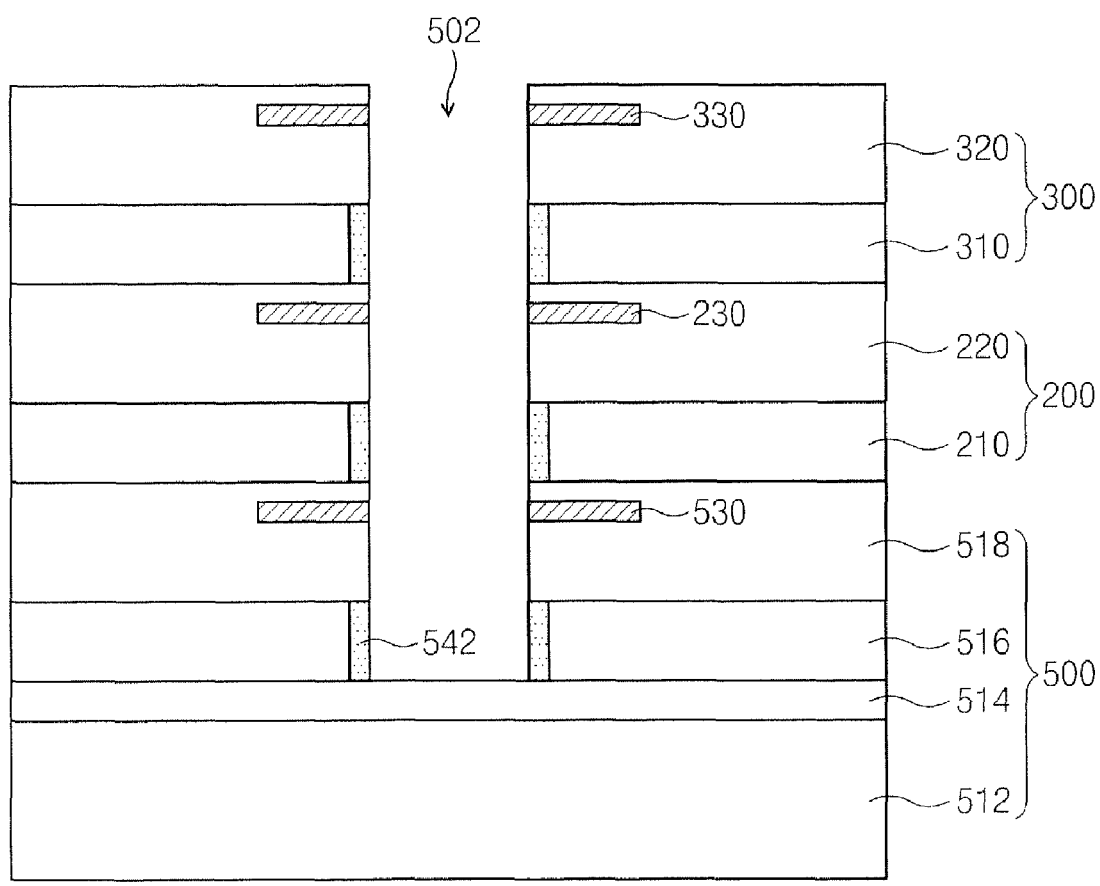

Referring to FIG. 7E, the insulating layer 540 is then anisotropically etched to form the insulating layers 542, as was described in connection with FIG. 4E.

Then, a conductive electrode may be formed in the via 502 and the semiconductor substrate 512, and the insulating layer 514 may be removed, as was described in connection with FIG. 4F.

FIGS. 8A-8E are cross-sectional views of microelectronic packages that include stepped vias according to various embodiments during intermediate fabrication steps according to various embodiments.

Figure 8A:
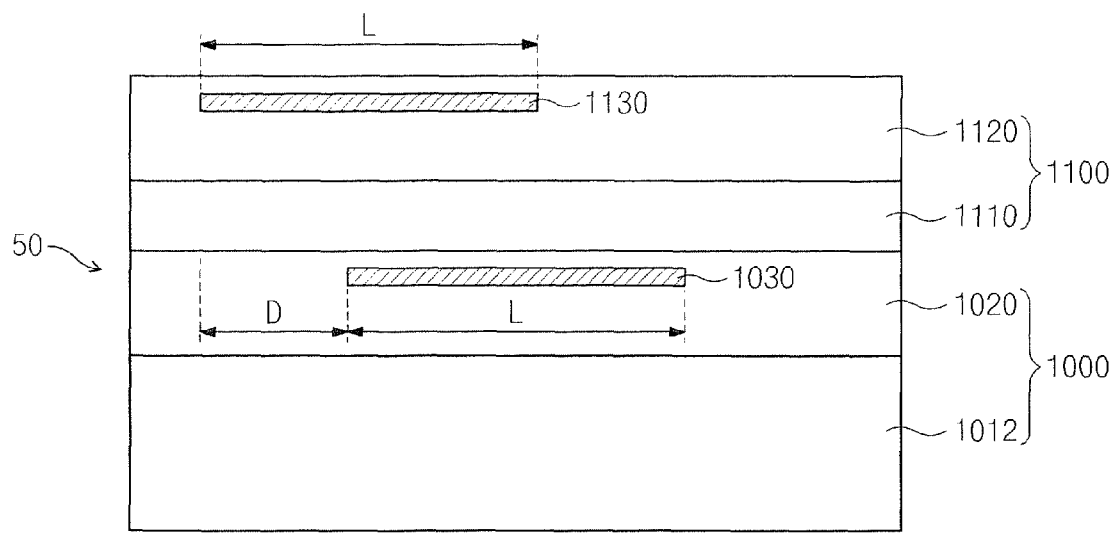
FIGS. 8A-8E are cross-sectional views of microelectronic packages that include stepped vias according to various embodiments during intermediate fabrication steps according to various embodiments.

Referring to FIG. 8A, a structure 50 may include a first integrated circuit 1000 and a second integrated circuit 1100 that are sequentially stacked. The first integrated circuit 1000 may include a first semiconductor layer 1012 and a first wiring layer 1020 having a first I/O pad 1030 therein. The second integrated circuit 1100 may include a second semiconductor layer 1100 and a second wiring layer 1120 including a second I/O pad 1130 therein. As shown in FIG. 8A, the first and second I/O pads 1030 and 1130 may be offset from each other. The composition and numbers of the integrated circuit devices 1000 and 1100 may vary as described in the above embodiments and will not be described again for the sake of brevity. In some embodiments, the first and second integrated circuits 1100 and 1110 may be the same functional device, except for the relative positions of the I/O pads 1030 and 1130. In other embodiments, different types of integrated circuits may be provided. As also shown, the I/O pads 1030 and 1130 may have an equal length L and may be offset by a distance D. In other embodiments, however, the lengths need not be the same, as long as the edges of the pads are offset from one another.

Figure 8B:
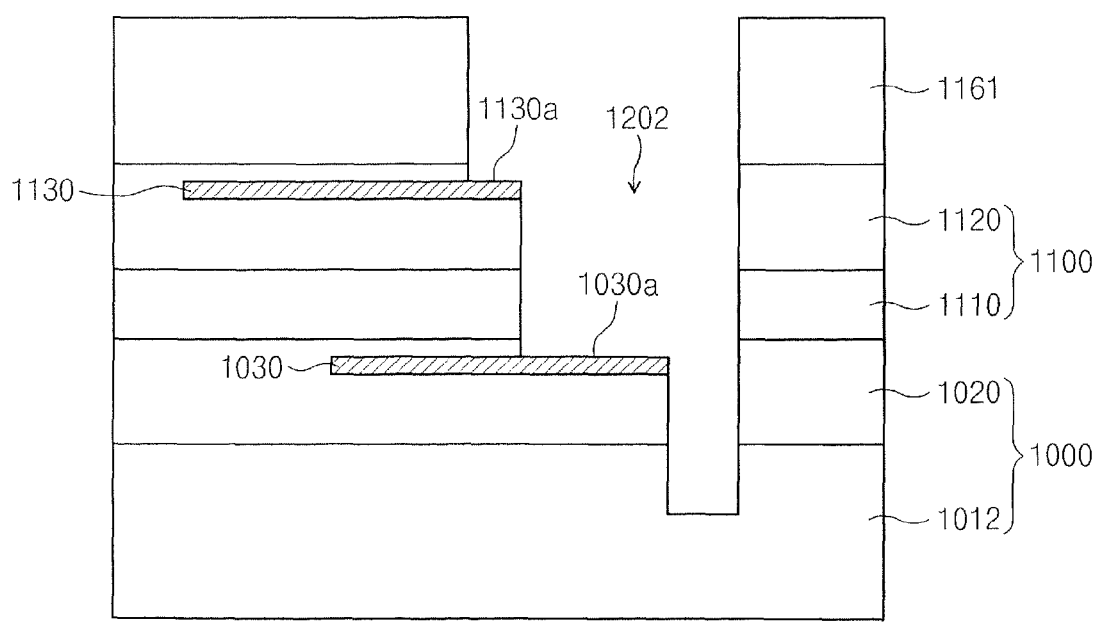

Referring now to FIG. 8B, a first mask 1161 is formed on the structure using, for example, photoresist. The first mask 1161 is then patterned. The removed portion of the first mask 1161 may correspond to a portion 1130a of the second pad 1130, and a portion 1030a of the first pad 1030, and a portion of the semiconductor layer 1012 where the pad 1030 is not located. A via 1202 is then formed using the first mask 1161 and the exposed portions 1030a and 1130a of the first and second I/O pads 1030 and 1130, respectively, as etch stops. Thus, the via 1202 may extend vertically at the boundaries of the pads 1130 and 1030. Moreover, as shown in FIG. 8B, the via 1202 may also penetrate at least partway into the first semiconductor layer 1012. In other embodiments, the via 1202 may penetrate entirely through the layer 1012. Thus, in embodiments of FIG. 8B, a single photoresist pattern 1161 may be used in combination with the first and second I/O pads 1030 and 1130 acting as etch stop layers. Thus, a stepped via 1202 may be formed that recesses a sidewall of the second integrated circuit 1100 relative to a sidewall of the first integrated circuit 1000, so as to expose a portion 1030a of the wiring on the face of the first integrated circuit 1000.

Figure 8C:
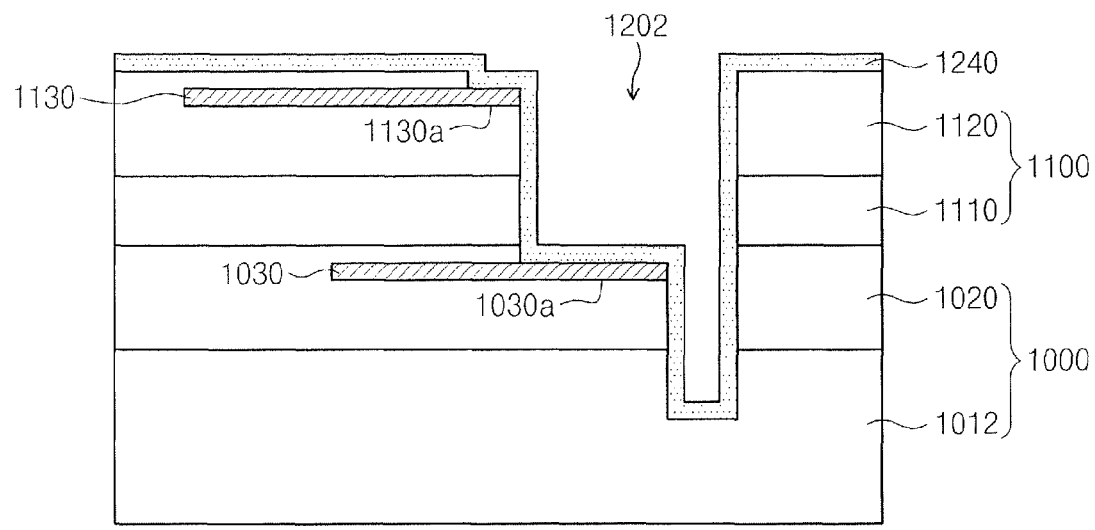

Referring now to FIG. 8C, an insulating layer 1240 may be conformally formed on the exposed portion of the via 1202. The insulating layer 1240 may comprise silicon oxide, silicon nitride, polymer and/or other insulating layers.

Figure 8D:
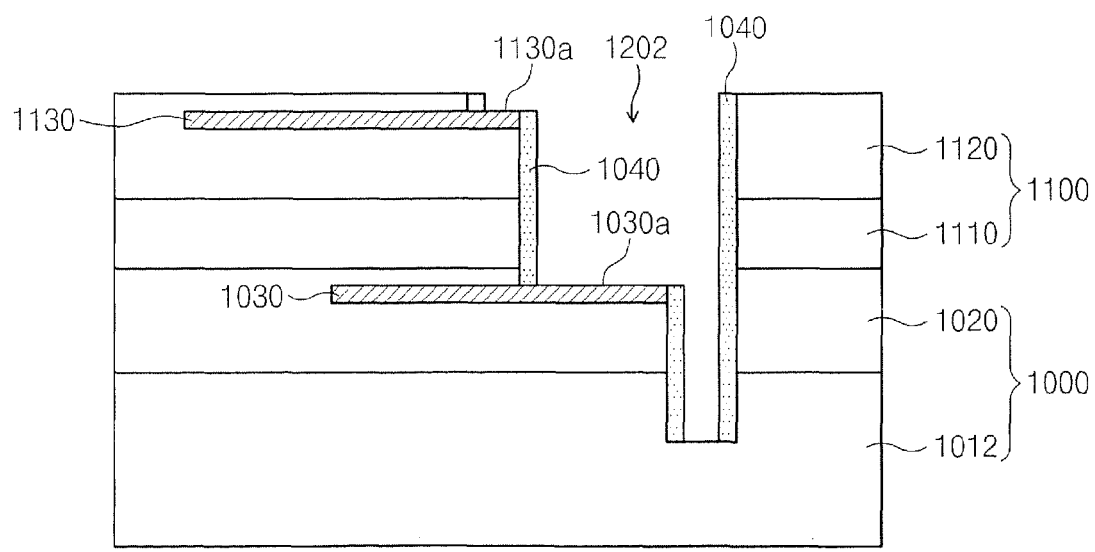

Referring now to FIG. 8D, the structure is then anisotropically etched so as to form an insulating layer 1040 on sidewalls of the via 1202. In some embodiments, the insulating layer 1040 may be formed on sidewalls of the semiconductor layers 1012, 1110 and the wiring layers 1020 and 1120. The insulating layer 1040 may be removed from horizontal surfaces, so as to expose the portions 1030a, 1130a of the I/O pads 1030, 1130.

Figure 8E:
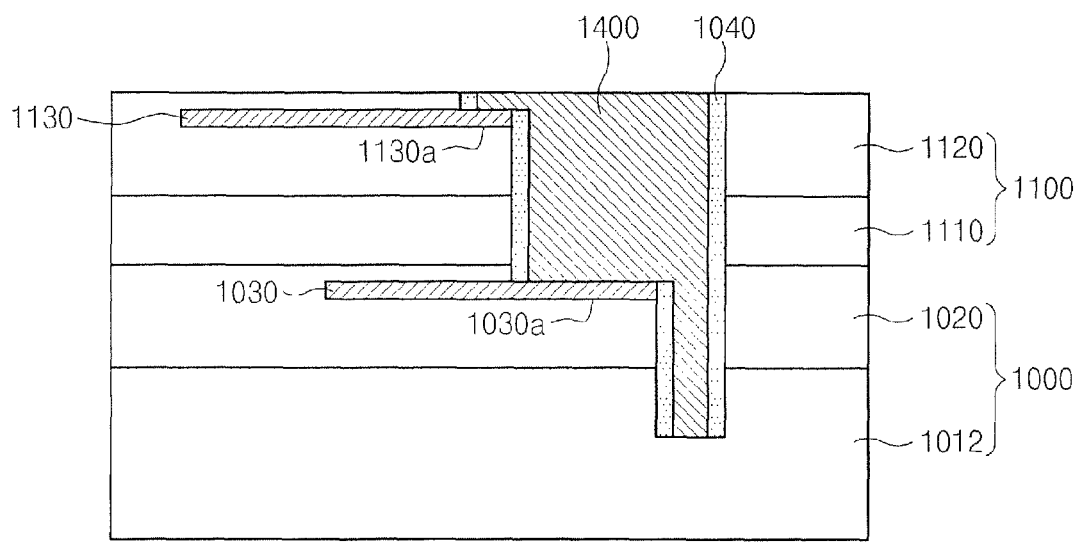

Referring now to FIG. 8E, a conductive layer is formed in the via 1202 and on the surface of the structure, and may then be planarized to form a monolithic conductive electrode 1400. The monolithic conductive electrode 1400 electrically contacts the exposed portions 1030a, 1130a of the I/O pads 1030 and 1130. Then, the bottom surface of the first semiconductor layer 1012 may be polished or otherwise etched to expose the monolithic conductive electrode 1400. Dicing and further packaging may then take place, as desired.

Figure 9A:
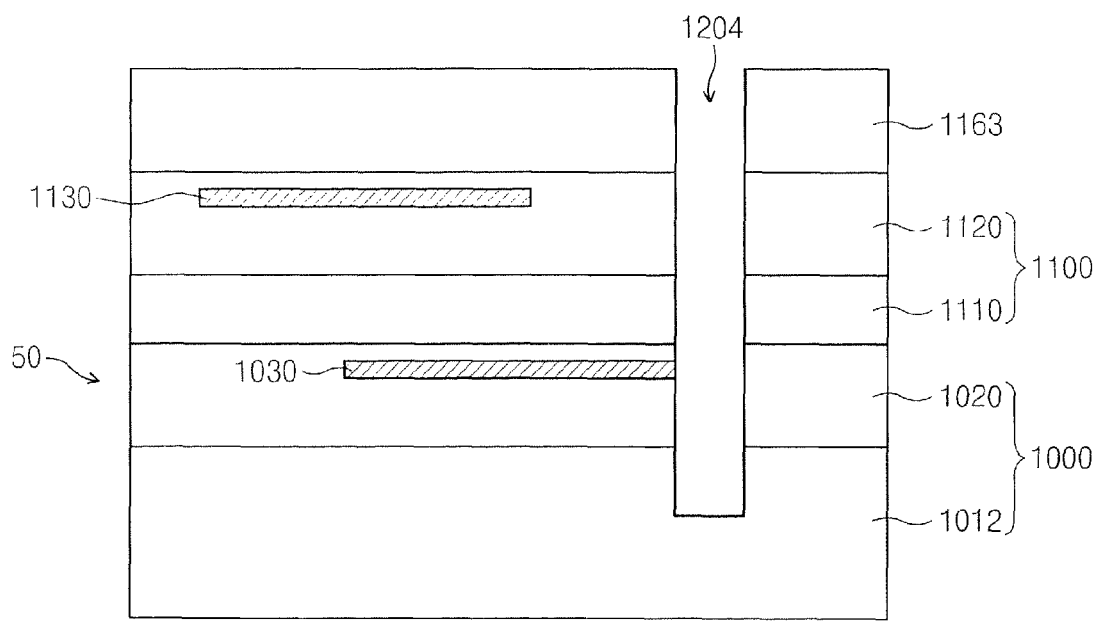
FIGS. 9A-9C are cross-sectional views of other microelectronic packages that include stepped vias according to various embodiments during intermediate fabrication steps according to still other embodiments.
Figure 9B:
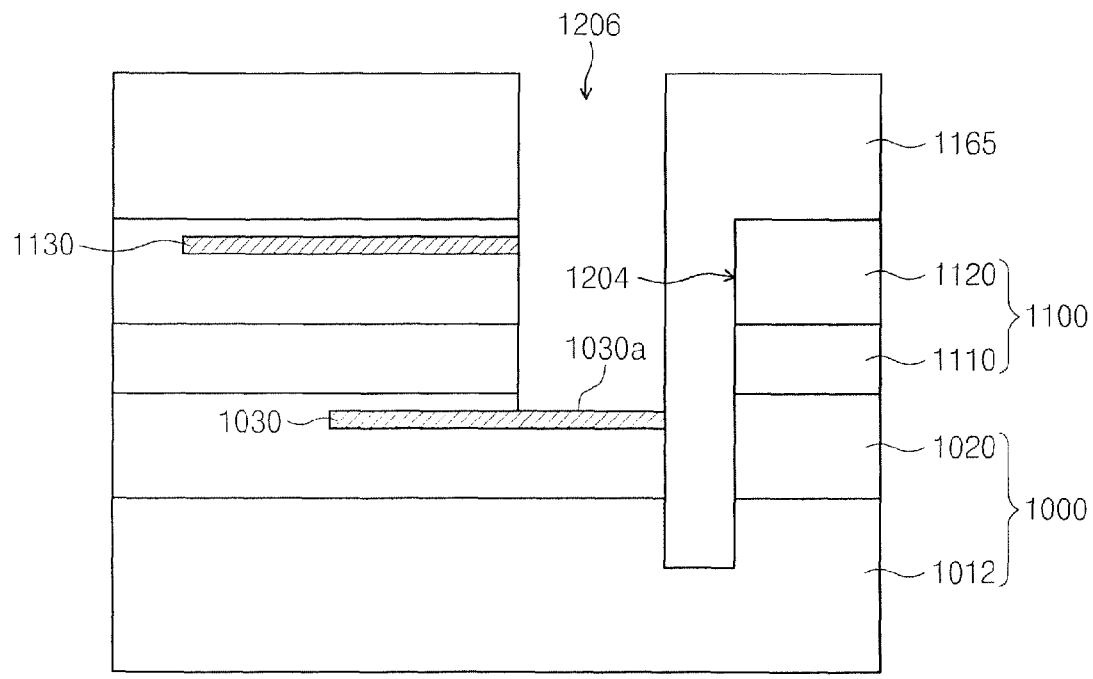
Figure 9C:
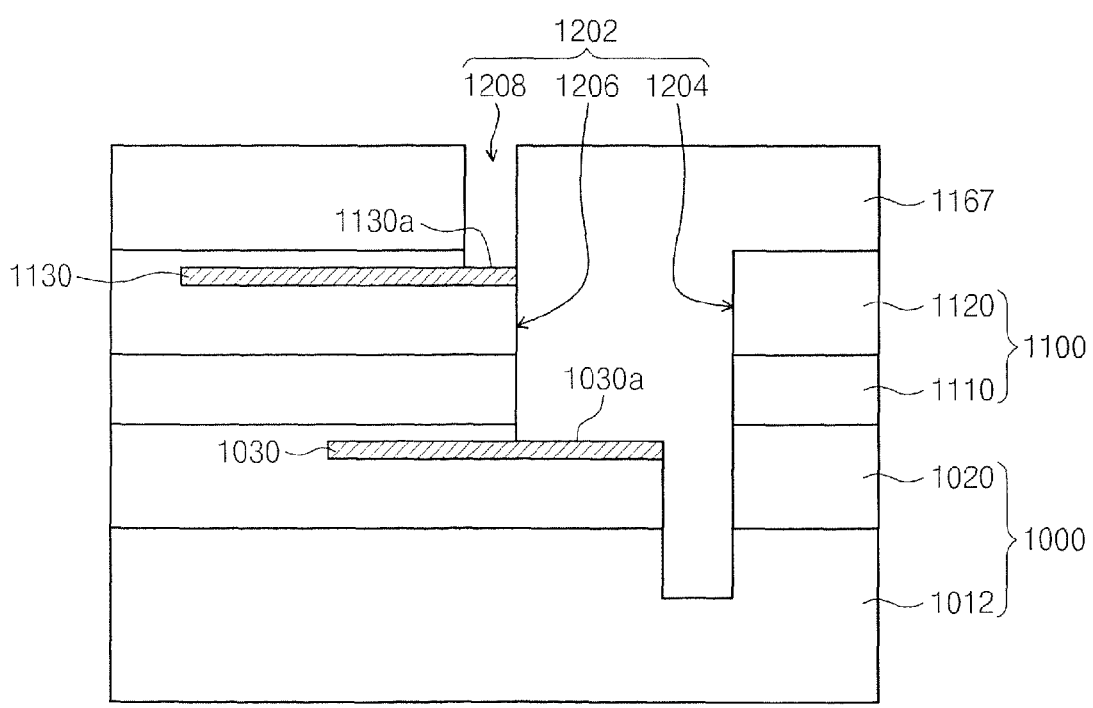

FIGS. 9A-9C are cross-sectional views of other microelectronic packages that include stepped vias according to various embodiments during intermediate fabrication steps according to still other embodiments. In these embodiments, the stepped via 1202 is formed using multiple masking steps rather than a single masking step.

In particular, as shown in FIG. 9A, a portion of the semiconductor layer 1012 of the first integrated circuit 1000 may be removed by etching using a first photoresist mask 1163 to form a first via 1204. The first via 1204 is not formed over the I/O pads 1030 or 1130.

Then, referring to FIG. 9B, a second via 1206 is formed to expose a portion 1030a of the first I/O pad 1030 using a second mask 1165. The exposed portion 1030a acts as an etch stop.

Then, referring to FIG. 9C, a third photoresist pattern 1167 may be formed above a portion 1130a of the second I/O pad 1130. A third via 1208 is then formed using the third photoresist pattern 1167 as an etch mask and the exposed portion 1130a as an etch stop. Thus, a stepped via 1202 is formed that includes the first, second and third vias 1204, 1206 and 1208. Subsequent processing may occur as was described in FIGS. 8C-8E.

Figure 10:
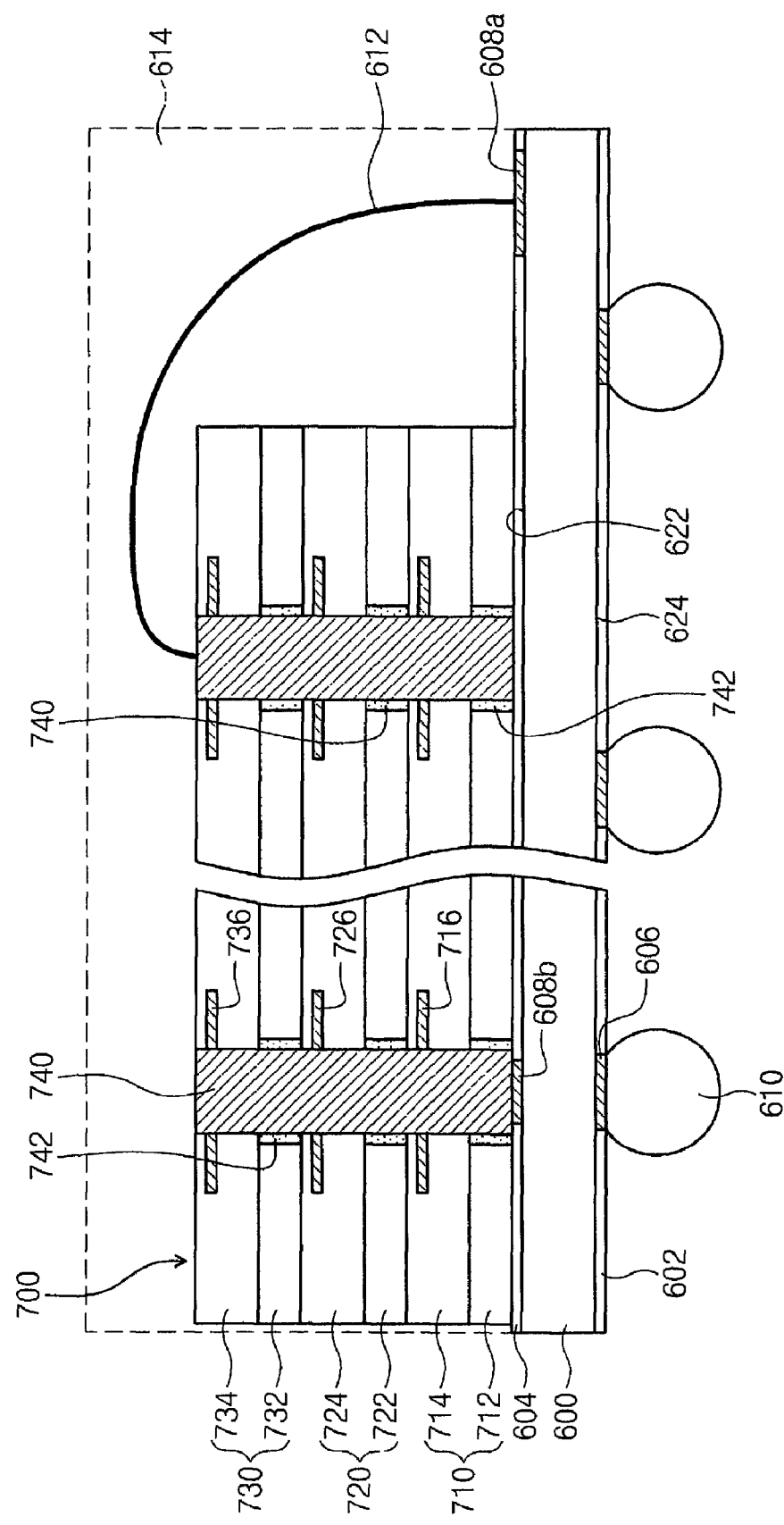
FIG. 10 is a cross-sectional view of a microelectronic package according to still other embodiments of the invention.

FIG. 10 is a cross-sectional view of a microelectronic package according to still other embodiments. Referring to FIG. 10, this package includes first, second and third integrated circuits 710, 720 and 730 that each include a semiconductor layer 712, 722, 732 and a wiring layer 714, 724, 734, respectively, wherein an I/O pad 716, 726, 736, respectively, is included in each wiring layer. A sidewall insulating layer 742 and a monolithic conductive via 740 is also included. The integrated circuits 700 are mounted on a mounting substrate 600, which may include a printed circuit board or other conventional mounting substrate.

The mounting substrate 600 may include an upper surface 622 adjacent the integrated circuits 700 and a lower surface 624 remote from the integrated circuits 700. A first package pad 608a is provided on the upper surface 622 and is electrically connected to a wire 612 that itself is connected to the conductive via 740. The first package pad 608a may comprise copper (Cu), aluminum (Al), nickel (Ni), platinum (Pt), silver (Ag) and/or gold (Au). The first package pad 608a may be close to an edge of the mounting substrate 600. Moreover, a second package pad 608b may be provided in an insulating layer 604 that is on the upper surface 622 of the mounting substrate 600. A plurality of second package pads 608b may be provided in an array at regular intervals in a row parallel to an edge of the mounting substrate 600 and/or in other arrangements.

A plurality of outer package pads 606 may be provided in an insulating layer 602 on the bottom surface 624 of the mounting substrate 600. One or more connection terminals 610 may be disposed on the lower surface 624 and electrically connected to the outer package pads 606. The connection terminals 610 may be solder balls or solder bumps for connection with an external device, and may comprise gold (Au), lead (Pb), silver (Ag), nickel (Ni), copper (Cu) and/or tin (Sn) alloys. For example, the connection terminal 610 may comprise Cu—Ni—Pb, Cu—Ni—Au, Cu—Ni, Ni—Au and/or Ni—Ag. The outer package pads 606 may have relatively good conductivity and may comprise copper (Cu), aluminum (Al), nickel (Ni), platinum (Pt), silver (Ag) and/or gold (Au).

In some embodiments, the integrated circuits 710, 720 and 730 may be memory integrated circuits that include a peripheral circuit region and a cell region. The integrated circuits 710, 720 and 730 may include a nonvolatile memory, a random access memory and/or other memories, such as a flash memory chip, a PRAM chip, an SRAM chip, and MRAM chip and/or a DRAM chip.

It will be understood that the various internal and external connections shown in FIG. 10 may be varied considerably.

For example, in embodiments of FIG. 10, a lower end of the left conductive via 740 is connected to a second package pad 608b and an upper end of the right conductive via 740 is connected to a first package pad 608a by a wire 612. However, many other configurations of connections may be provided in other embodiments. An encapsulation or mold layer 614 may be used to seal the entire microelectronic package and the connection wire 612.

Figure 11:
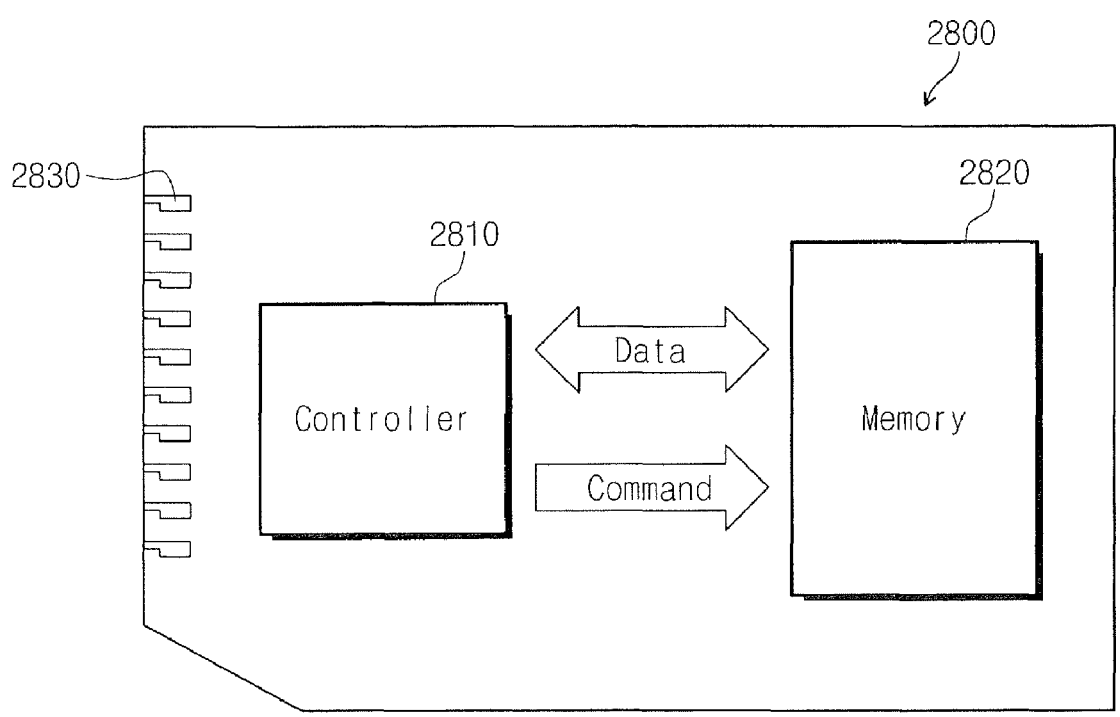
FIG. 11-12 are block diagrams of electronic systems that can use microelectronic packages according to various embodiments.

FIG. 11 is a block diagram of a card that may be embodied using microelectronic packages according to various embodiments. For example, a memory card 2800 includes a memory device 2820 and a controller device 2810 that exchange data and commands therebetween and communicate with external devices through external input/output connectors 2830. In embodiments of FIG. 11, the card 2800 may be embodied as shown in FIG. 10, with the controller 2810 being the first integrated circuit 710, the memory 2820 being the second and third integrated circuits 720 and 730, and the input/output connectors being the connection terminals 610. Many other configurations may be provided.

Figure 12:
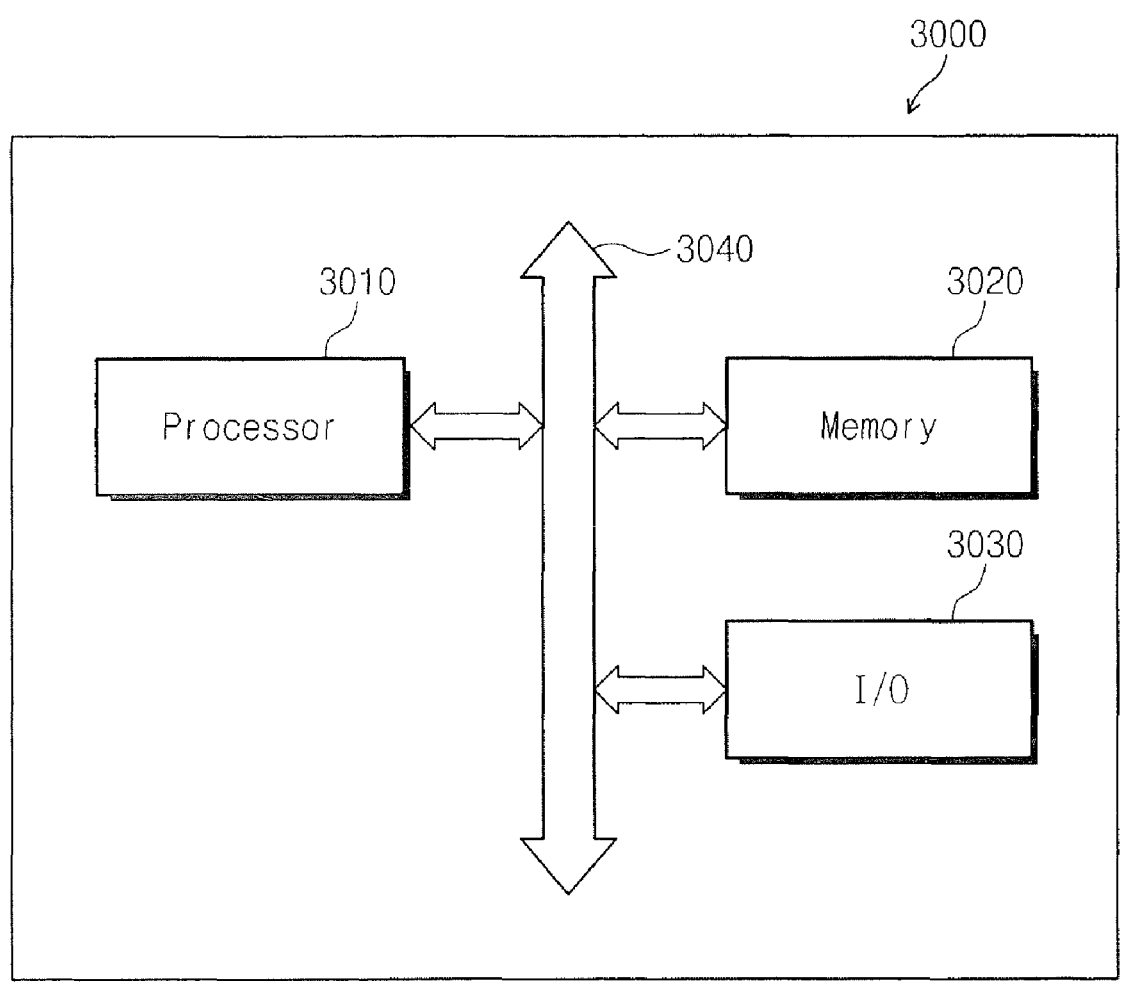

FIG. 12 is a block diagram of other embodiments of the present invention, wherein an electronic system 3000 includes a processor 3010, a memory 3020 and an input/output system 3030 that are interconnected by a bus 3040. Embodiments of FIG. 12 may be embodied as shown in FIG. 10, such that the processor 3010 corresponds to the first integrated circuit 710, the memory 3020 corresponds to the second integrated circuit 720 and the input/output controller 3030 corresponds to a third integrated circuit 730. The bus 3040 may be embodied by the conductive electrodes 740. Many other configurations may be provided.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A microelectronic package, comprising:
a plurality of integrated circuits that are stacked upon one another, a respective integrated circuit including a semiconductor layer having microelectronic devices therein and a wiring layer on the semiconductor layer having wiring that selectively interconnects the microelectronic devices; and
a monolithic conductive via that extends through the plurality of integrated circuits including through the semiconductor layers and through the wiring layers thereof, the monolithic conductive via selectively electrically contacting the wiring,
wherein the semiconductor layers include recessed sidewalls relative to the wiring layers, the microelectronic package further comprising an insulating layer between the recessed sidewalls and the monolithic conductive via.

2. A microelectronic package according to claim 1 wherein the plurality of integrated circuits are directly attached to one another without an intervening glue layer.

3. A microelectronic package according to claim 1 wherein the plurality of integrated circuits comprise a plurality of integrated circuit wafers that are stacked upon one another.

4. A microelectronic package according to claim 1 wherein the wiring includes input/output pads and wherein the monolithic conductive via selectively electrically contacts the input/output pads.

5. A microelectronic package according to claim 1 wherein the plurality of integrated circuits comprise a memory integrated circuit, a memory controller integrated circuit, a processor integrated circuit and/or an input/output controller integrated circuit.

6. A microelectronic package, comprising:
   a plurality of integrated circuits that are stacked upon one another, a respective integrated circuit including a semiconductor layer having microelectronic devices therein and a wiring layer on the semiconductor layer having wiring that selectively interconnects the microelectronic devices; and
   a monolithic conductive via that extends through the plurality of integrated circuits including through the semiconductor layers and through the wiring layers thereof, the monolithic conductive via selectively electrically contacting the wiring,
   wherein the plurality of integrated circuits comprises a first and a second integrated circuit that are stacked upon one another such that the wiring layer of the first integrated circuit is adjacent the semiconductor layer of the second integrated circuit;
   wherein a sidewall of the semiconductor layer of second integrated circuit is recessed relative to a sidewall of the wiring layer of the first integrated circuit so as to expose a portion of the wiring of the first integrated circuit; and
   wherein the monolithic conductive via is a stepped monolithic conductive via that electrically contacts the portion of the wiring of the first integrated circuit.

7. A microelectronic package according to claim 6 further comprising an insulating layer between the sidewalls of the first and second integrated circuits and the monolithic conductive via.

8. A microelectronic package according to claim 6 wherein the plurality of integrated circuits comprise a plurality of integrated circuit wafers that are stacked upon one another.

9. A microelectronic package, comprising:
   a plurality of integrated circuits that are stacked upon one another, a respective integrated circuit including a semiconductor layer having microelectronic devices therein and a wiring layer on the semiconductor layer having wiring that selectively interconnects the microelectronic devices; and
   a monolithic conductive via that extends through the plurality of integrated circuits including through the semiconductor layers and through the wiring layers thereof, the monolithic conductive via selectively electrically contacting the wiring,
   wherein the plurality of integrated circuits are directly attached to one another by oxygen bonds.

10. A microelectronic package according to claim 9 wherein the plurality of integrated circuits comprise a plurality of integrated circuit wafers that are stacked upon one another.

* * * * *